(12) United States Patent
Sasaki et al.

(10) Patent No.: US 10,840,236 B2
(45) Date of Patent: Nov. 17, 2020

(54) SEMICONDUCTOR DEVICE

(71) Applicant: Murata Manufacturing Co., Ltd., Kyoto-fu (JP)

(72) Inventors: Kenji Sasaki, Nagaokakyo (JP); Isao Obu, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 16/038,040

(22) Filed: Jul. 17, 2018

(65) Prior Publication Data
US 2019/0051645 A1 Feb. 14, 2019

(30) Foreign Application Priority Data
Aug. 8, 2017 (JP) ................. 2017-153337

(51) Int. Cl.
| | | |
|---|---|---|
| H01L 27/02 | (2006.01) | |
| H01L 27/06 | (2006.01) | |
| H01L 29/47 | (2006.01) | |
| H01L 29/417 | (2006.01) | |
| H01L 29/08 | (2006.01) | |
| H01L 29/737 | (2006.01) | |
| H01L 29/423 | (2006.01) | |
| H01L 29/872 | (2006.01) | |

(52) U.S. Cl.
CPC ...... *H01L 27/0255* (2013.01); *H01L 27/0248* (2013.01); *H01L 27/0647* (2013.01); *H01L 29/0821* (2013.01); *H01L 29/41708* (2013.01); *H01L 29/42304* (2013.01); *H01L 29/47* (2013.01); *H01L 29/7371* (2013.01); *H01L 29/872* (2013.01)

(58) Field of Classification Search
None
See application file for complete search history.

(56) References Cited

U.S. PATENT DOCUMENTS

| | | | |
|---|---|---|---|
| 6,525,388 B1* | 2/2003 | Shimawaki | H01L 27/0605 257/197 |
| 2003/0157775 A1* | 8/2003 | Kurokawa | H01L 21/8252 438/312 |
| 2005/0001233 A1* | 1/2005 | Sugiyama | H01L 29/0817 257/183 |
| 2013/0137382 A1* | 5/2013 | Cismaru | H01L 29/41708 455/73 |

FOREIGN PATENT DOCUMENTS

| | | |
|---|---|---|
| JP | H03-064929 A | 3/1991 |
| JP | 2001-144097 A | 5/2001 |
| JP | 2005-123221 A | 5/2005 |
| JP | 2006-324267 A | 11/2006 |

\* cited by examiner

*Primary Examiner* — Jay C Chang
(74) *Attorney, Agent, or Firm* — Studebaker & Brackett PC

(57) ABSTRACT

A semiconductor device includes a sub-collector layer disposed on a substrate, a bipolar transistor including a collector layer formed of a semiconductor having a lower carrier concentration than the sub-collector layer, a base layer, and an emitter layer, and a protection diode including a Schottky electrode. The Schottky electrode forms, in a partial region of an upper surface of the collector layer, a Schottky junction to the collector layer and is connected to one of the base layer and the emitter layer. In the collector layer, a part that forms a junction to the base layer and a part that forms a junction to the Schottky electrode are electrically connected to each other via the collector layer.

16 Claims, 29 Drawing Sheets

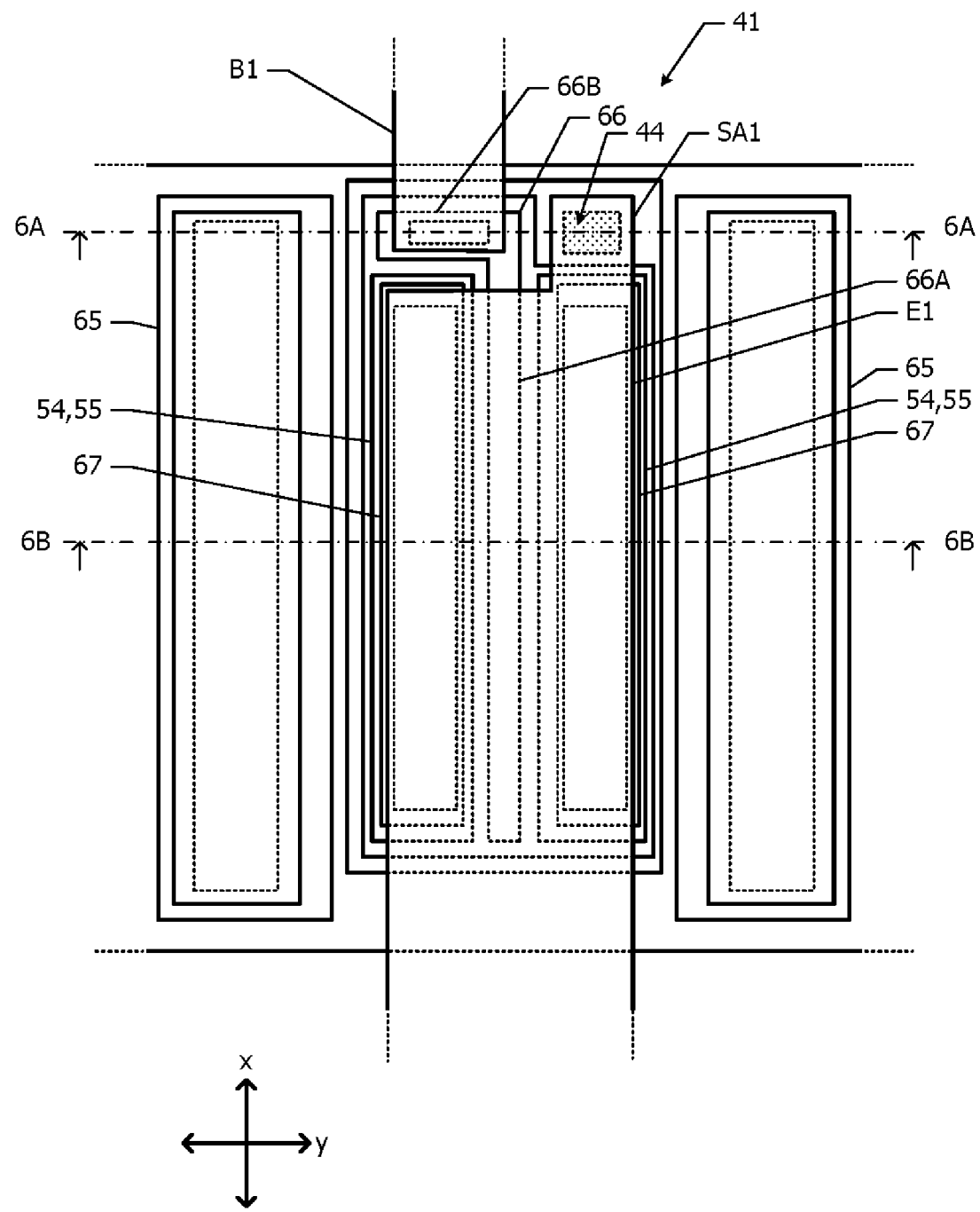

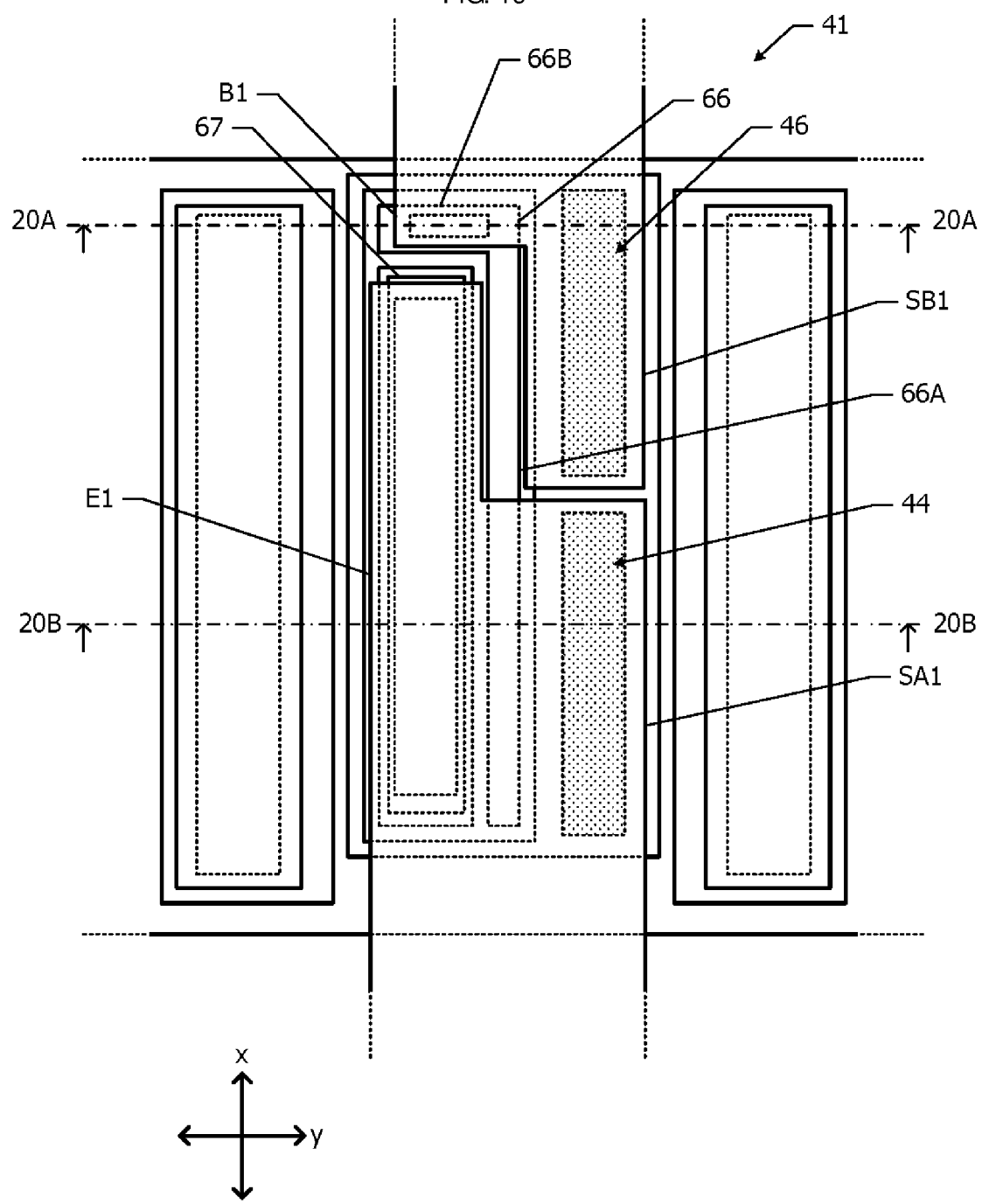

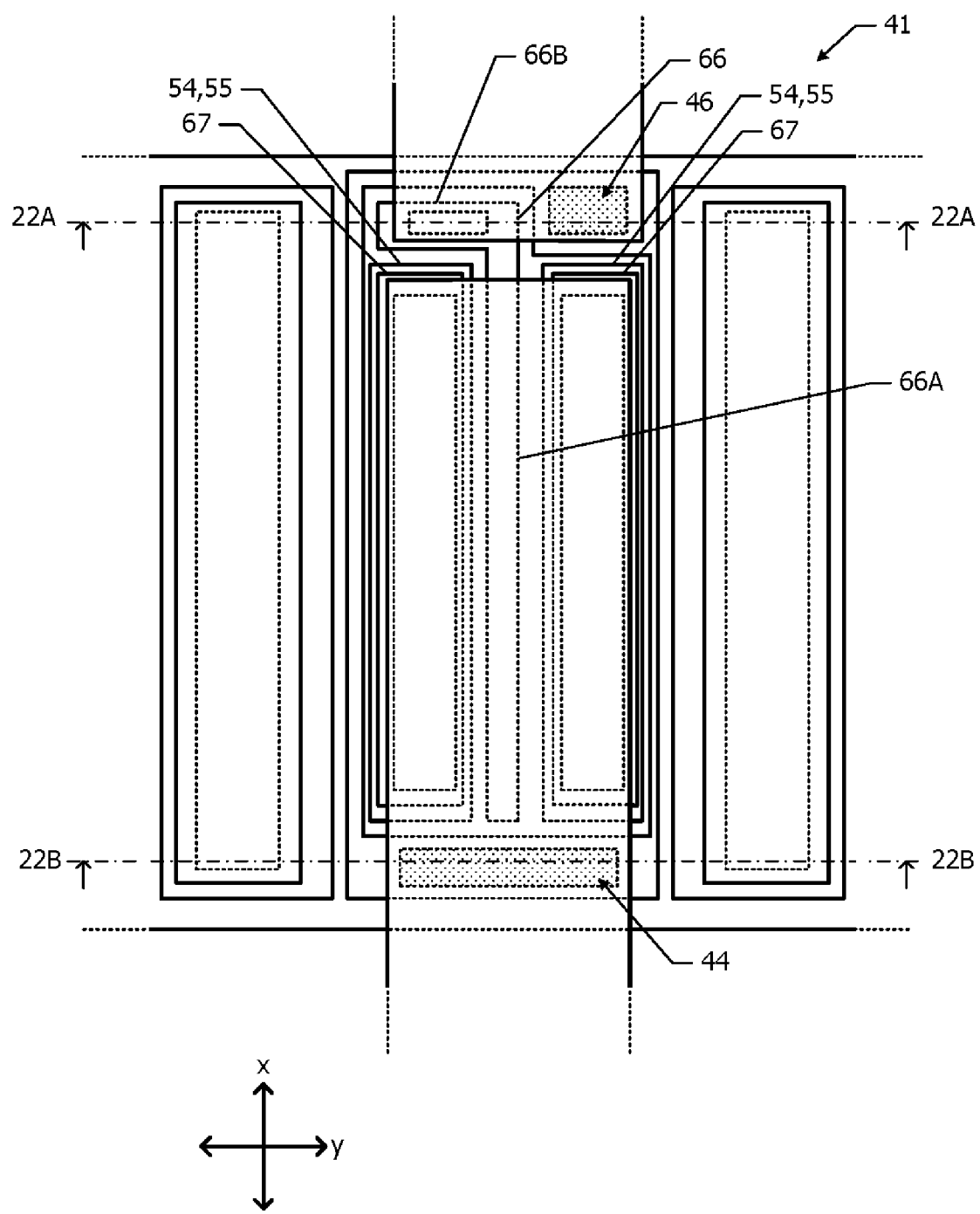

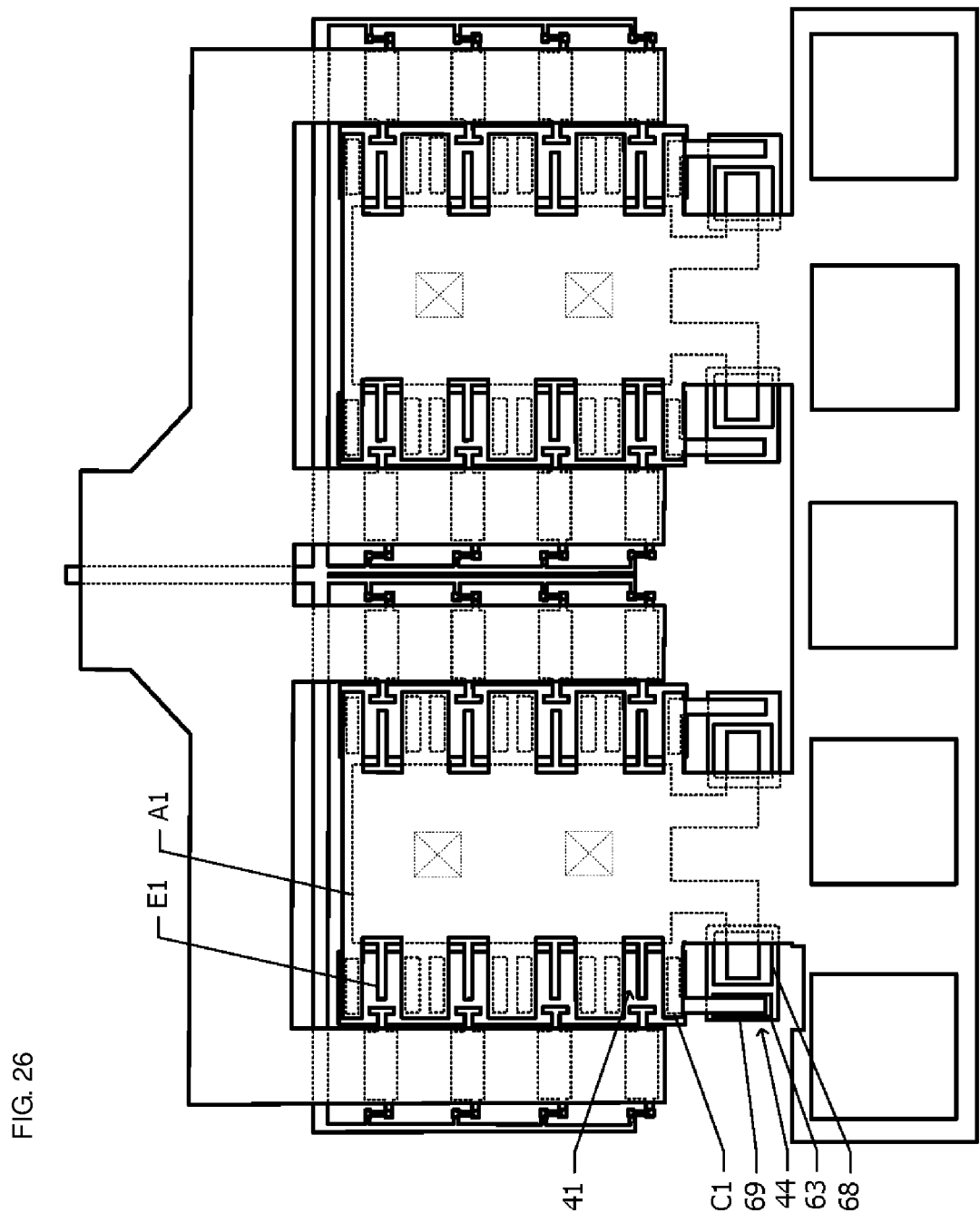

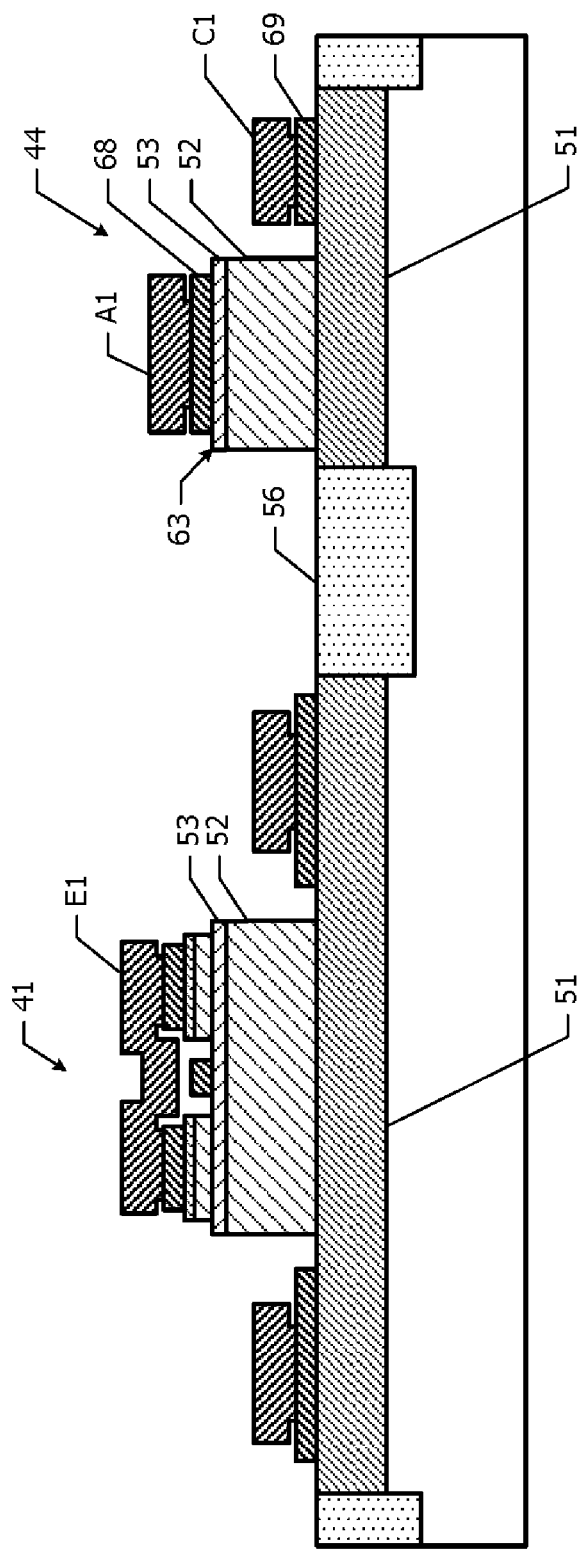

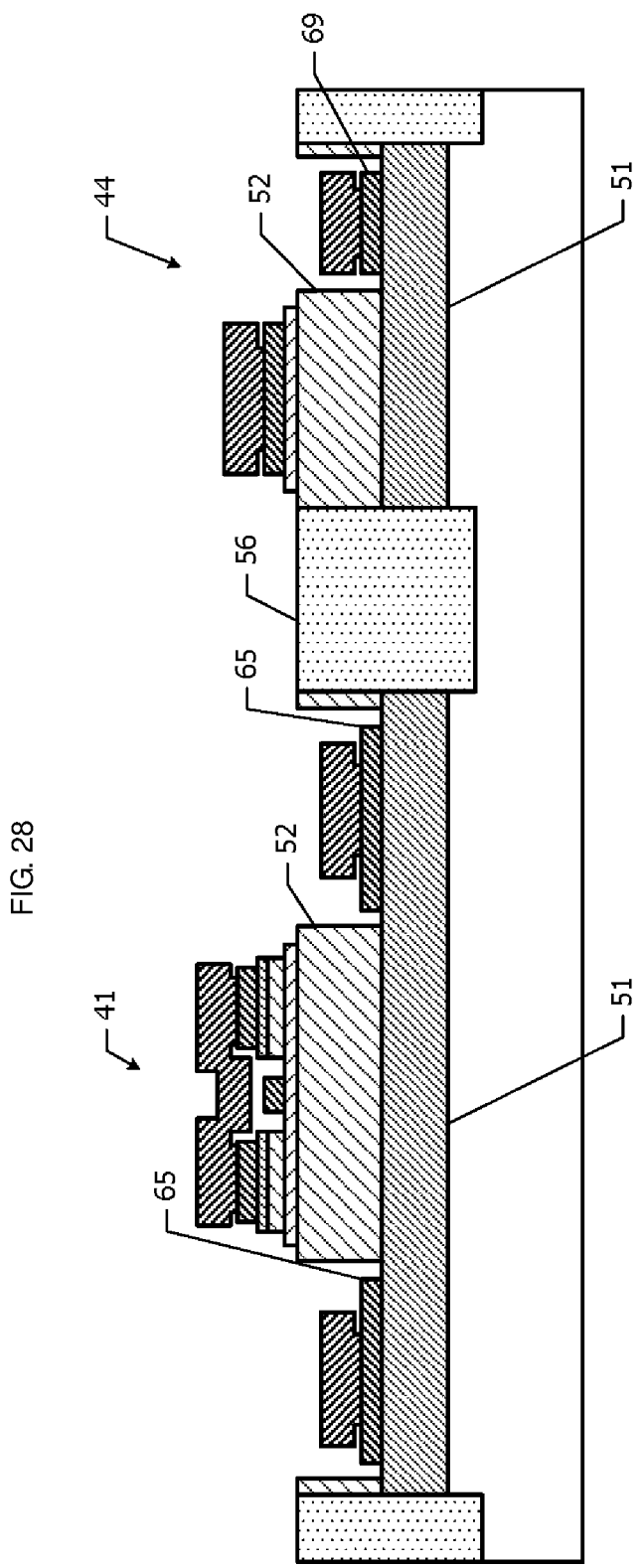

SEMICONDUCTOR DEVICE

CROSS-REFERENCE TO RELATED APPLICATION

This application claims benefit of priority to Japanese Patent Application No. 2017-153337, filed Aug. 8, 2017, the entire content of which is incorporated herein by reference.

BACKGROUND

Technical Field

The present disclosure relates to a semiconductor device.

Background Art

In order to protect a bipolar transistor from breakdown due to electrostatic discharge (ESD), a protection diode is connected between the collector and the emitter or between the collector and the base. Japanese Unexamined Patent Application Publication No. 3-64929 discloses a semiconductor device in which a heterojunction bipolar transistor (HBT) and a p-n diode for reverse surge absorption are integrated. In this semiconductor device, an HBT region and a p-n diode region are defined on a semiconductor substrate, and the two regions are isolated from each other by forming a trench in a surface of the semiconductor substrate.

Japanese Unexamined Patent Application Publication No. 2005-123221 discloses a bipolar transistor having a protective function against overvoltage application. In this semiconductor device, a Schottky diode is used as a diode having the protective function. An HBT including an $n^-$-type collector layer, a p-type base layer, and an n-type emitter layer is disposed on an $n^+$-type sub-collector layer. A Schottky electrode is disposed on a portion of an upper surface of the sub-collector layer, the portion being located outside the region where the HBT is disposed.

Japanese Unexamined Patent Application Publication No. 2001-144097 discloses a semiconductor device that prevents an excessive surge current from flowing in a bipolar transistor. In this semiconductor device, an n-type collector contact (sub-collector) layer is disposed on a semi-insulating substrate, and an HBT including a collector layer, a base layer, and an emitter layer is disposed on the n-type collector contact (sub-collector) layer. A Schottky diode in which a collector layer and a metal wiring line are brought into contact with each other is formed on a portion of the collector contact layer, the portion being located outside the region where the HBT is disposed. A collector electrode of the HBT is disposed on the collector contact layer between the collector layer of the HBT and the collector layer of the Schottky diode.

Japanese Unexamined Patent Application Publication No. 2006-324267 discloses a semiconductor device in which breakdown of a transistor due to a back electromotive force generated in an inductor is prevented. In this semiconductor device, a diode is connected in parallel to a line through which only a DC signal passes and which connects a collector of an HBT and a power supply. The diode is disposed on the side of the structure of the HBT.

SUMMARY

The miniaturization of semiconductor devices including a bipolar transistor and a protection diode has been desired. Accordingly, the present disclosure provides a semiconductor device including a bipolar transistor and a protection diode and having a structure suitable for miniaturization.

A semiconductor device according to a preferred embodiment of the present disclosure includes a sub-collector layer disposed on a substrate and formed of a semiconductor; a bipolar transistor including a collector layer disposed on the sub-collector layer and formed of a semiconductor having a lower carrier concentration than the sub-collector layer, a base layer disposed on the collector layer and formed of a semiconductor, and an emitter layer disposed on the base layer and formed of a semiconductor; and a first protection diode including a first Schottky electrode that forms, in a partial region of an upper surface of the collector layer, a Schottky junction to the collector layer and that is connected to one of the base layer and the emitter layer. In the collector layer, a part that forms a junction to the base layer and a part that forms a junction to the first Schottky electrode are electrically connected to each other via the collector layer.

The first protection diode is arranged between the collector and the emitter or between the collector and the base of the bipolar transistor. With this configuration, the bipolar transistor can be protected from one of an overvoltage applied between the collector and the emitter and an overvoltage applied between the collector and the base. Since the collector layer of the bipolar transistor is also used as a semiconductor layer of the first protection diode, miniaturization of the semiconductor device can be achieved compared with a configuration in which a semiconductor layer for the first protection diode is provided separately from the collector layer for the bipolar transistor.

In the semiconductor device, at least a part of the collector layer may form a mesa-shaped first mesa portion disposed on the sub-collector layer. The base layer may form at least an upper layer portion of a second mesa portion disposed on the first mesa portion, and the first Schottky electrode may form a Schottky junction to an upper surface of the first mesa portion.

The collector layer, the base layer, and the emitter layer of the bipolar transistor are arranged in a region surrounded by an outer peripheral line of the first mesa portion. In addition, the first protection diode is also arranged in this region. Therefore, miniaturization of the semiconductor device can be achieved.

The semiconductor device may further include a second protection diode including a second Schottky electrode that forms, in a region different from the region where the first Schottky electrode forms the Schottky junction to the collector layer, a Schottky junction to the collector layer and that is connected to, of the base layer and the emitter layer, a layer that is not connected to the first Schottky electrode.

Since the protection diodes are connected between the collector and the emitter and between the collector and the base of the bipolar transistor, the bipolar transistor can be protected from both an overvoltage applied between the collector and the emitter and an overvoltage applied between the collector and the base.

The semiconductor device may further include a collector electrode that is ohmically connected to the sub-collector layer; a base electrode that is ohmically connected to the base layer; and an emitter electrode that is ohmically connected to the emitter layer. The collector electrode may include at least one conductor portion that flanks or surrounds one region in plan view, and a first Schottky junction region of the first protection diode, the base electrode, and the emitter electrode may be arranged in a base-emitter arrangement region that is flanked or surrounded by the collector electrode.

Since the first Schottky junction region of the first protection diode is arranged in the base-emitter arrangement region in which the base electrode and the emitter electrode of the bipolar transistor are arranged, it is not necessary to secure a region for the first protection diode outside the region in which the bipolar transistor is arranged. Therefore, miniaturization of the semiconductor device can be achieved.

The first Schottky junction region, the emitter electrode, and the base electrode may each include a portion that is long in a first direction. Also, the portions of the first Schottky junction region, the emitter electrode, and the base electrode that are long in the first direction may be arranged side by side in a direction orthogonal to the first direction.

The bipolar transistor and the first protection diode are disposed in a narrow region so as to be easily arranged. The emitter electrode and the base electrode may each include a portion that is long in a first direction. The portions of the emitter electrode and the base electrode that are long in the first direction may be arranged side by side in a direction orthogonal to the first direction. Also, the first Schottky junction region may be arranged at a position apart in the first direction with respect to at least one electrode of the emitter electrode and the base electrode. An increase in the dimension of the bipolar transistor in the direction orthogonal to the first direction can be suppressed.

The semiconductor device may further include an interlayer insulating film disposed on the emitter electrode and the base electrode and having contact holes corresponding to the emitter electrode and the base electrode; and an emitter wiring line and a base wiring line that are disposed on the interlayer insulating film and connected through the contact holes to the emitter electrode and the base electrode, respectively. The contact holes may include portions arranged along the portions of the emitter electrode and the base electrode that are long in the first direction. The parasitic resistance of the emitter electrode and the base electrode can be reduced.

The first protection diode is arranged between the collector and the emitter or between the collector and the base of the bipolar transistor. With this configuration, the bipolar transistor can be protected from one of an overvoltage applied between the collector and the emitter and an overvoltage applied between the collector and the base. Since the collector layer of the bipolar transistor is used also as a semiconductor layer of the first protection diode, miniaturization of the semiconductor device can be achieved compared with a configuration in which a semiconductor layer for the first protection diode is provided separately from the collector layer for the bipolar transistor.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 5 is a plan view of a semiconductor device according to a second embodiment;

FIG. 19 is a plan view of a semiconductor device according to the eighth embodiment;

FIG. 21 is a plan view of a semiconductor device according to a ninth embodiment;

FIG. 26 is a plan view of a semiconductor device according to a comparative example;

FIG. 27 is a sectional view of the semiconductor device according to the comparative example;

FIG. 28 is a sectional view of a semiconductor device according to another comparative example.

DETAILED DESCRIPTION

First Embodiment

A semiconductor device according to a first embodiment will be described with reference to FIGS. 1A to 4B.

Figure 1A:
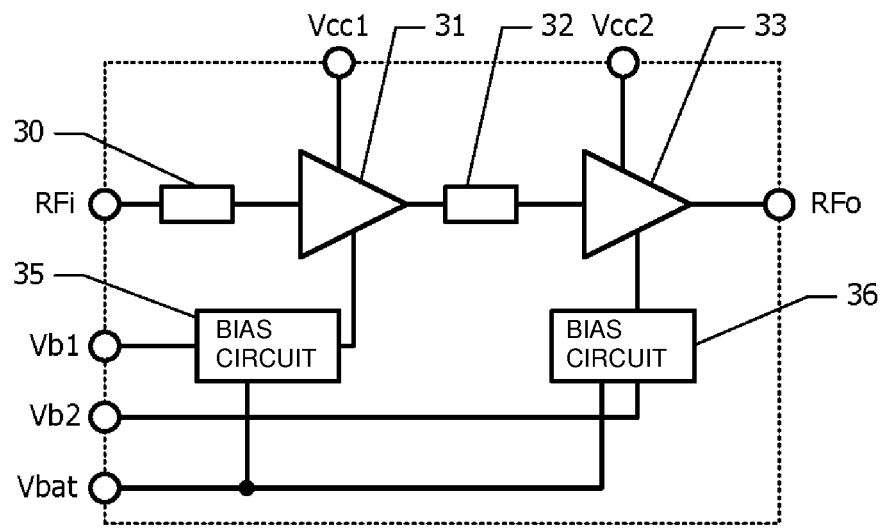
FIG. 1A is a block diagram of a power amplifier module including a semiconductor device according to a first embodiment.

FIG. 1A is a block diagram of a power amplifier module including a semiconductor device according to the first embodiment. An input signal input from an RF input terminal RFi is input to an input-stage amplifier circuit 31 via a matching circuit 30. The signal amplified by the input-stage amplifier circuit 31 is input to an output-stage amplifier circuit 33 via a matching circuit 32. The output signal amplified by the output-stage amplifier circuit 33 is output from an RF output terminal RFo.

A bias voltage terminal Vbat applies a bias voltage to bias circuits 35 and 36. On the basis of a signal input from a bias control terminal Vb1, the bias circuit 35 supplies a bias current to the input-stage amplifier circuit 31. On the basis of a signal input from a bias control terminal Vb2, the bias circuit 36 supplies a bias current to the output-stage amplifier circuit 33. A power supply voltage is applied from a power terminal Vcc1 to the input-stage amplifier circuit 31, and a power supply voltage is applied from a power terminal Vcc2 to the output-stage amplifier circuit 33.

Figure 1B:
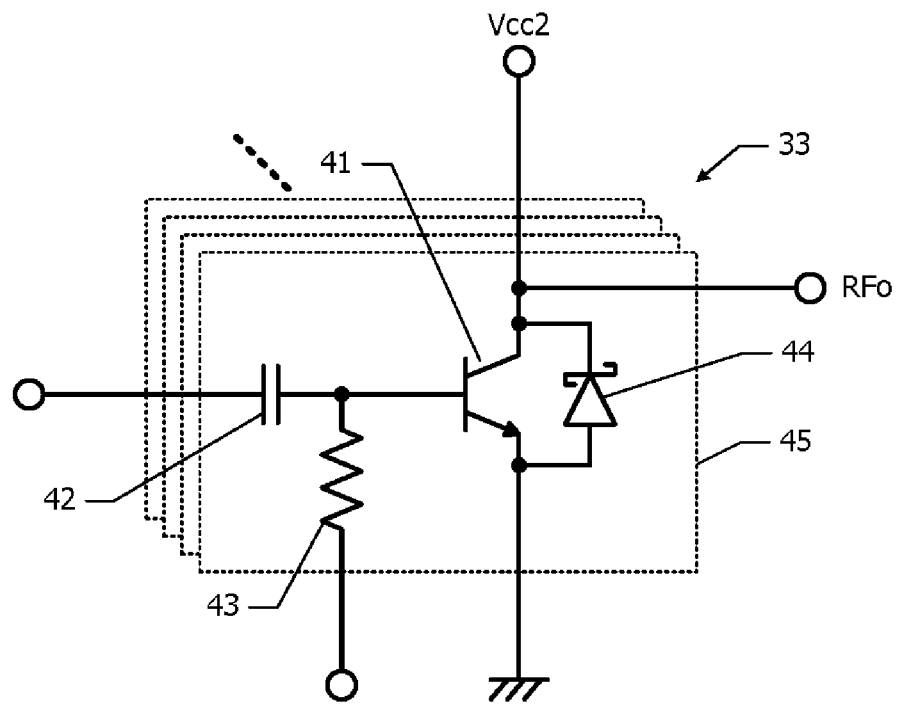
FIG. 1B is an equivalent circuit diagram of an output-stage amplifier circuit.

FIG. 1B is an equivalent circuit diagram of the output-stage amplifier circuit 33 (FIG. 1A). A radio-frequency (RF) input signal is input to the base of a heterojunction bipolar transistor (HBT) 41 via an input capacitor 42. A bias current is supplied to the HBT 41 via a ballast resistor 43. The emitter of the HBT 41 is grounded. The collector of the HBT 41 is connected to a power terminal Vcc2 and connected to an RF output terminal RFo. A protection diode 44 is connected between the emitter and the collector of the HBT 41 such that the direction from the emitter to the collector is the forward direction. The protection diode 44 has a function of conducting electricity when a negative voltage relative to the emitter of the HBT 41 is applied to the collector to thereby protect the HBT 41 from an overvoltage.

The HBT 41, the input capacitor 42, the ballast resistor 43, and the protection diode 44 constitute one circuit unit 45. A plurality of circuit units 45 are connected in parallel to constitute an output-stage amplifier circuit 33.

The basic configuration of the input-stage amplifier circuit 31 (FIG. 1A) is the same as the configuration of the output-stage amplifier circuit 33. The bias circuits 35 and 36 also include HBTs. The HBTs of the bias circuits 35 and 36 may also be connected to protection diodes.

Figure 2:
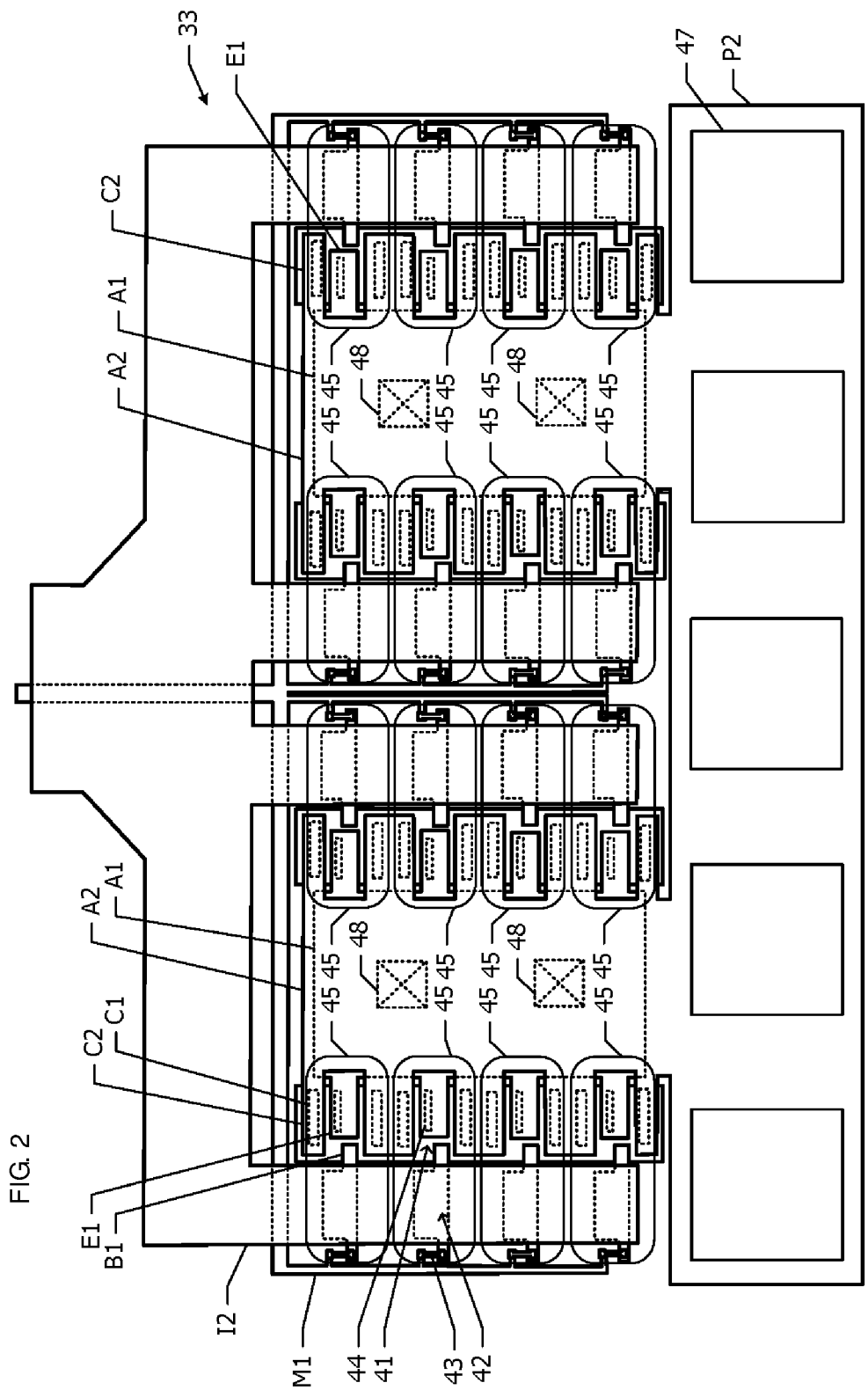
FIG. 2 is a plan view of an output-state amplifier circuit used in the semiconductor device according to the first embodiment.

FIG. 2 is a plan view of the output-state amplifier circuit 33 (FIG. 1A). For example, sixteen circuit units 45 are arranged in a matrix of four rows and four columns. In each of the regions of the circuit units 45, an HBT 41, an input capacitor 42, a ballast resistor 43, and a protection diode 44 (FIG. 1B) are arranged.

The HBT 41 includes a collector electrode, an emitter electrode, and a base electrode. Two metal wiring line layers are arranged on these electrodes. The collector electrode is connected to a collector wiring line C2 serving as a second layer with a collector wiring line C1 serving as a first layer therebetween. The emitter electrode is connected to an emitter wiring line E1 serving as the first layer. The base electrode is connected to a base wiring line B1 serving as the first layer.

The collector wiring line C2 serving as the second layer and connected to the collectors of the HBTs 41 of the plurality of circuit units 45 in the first column and the second column is continuous with a conductive plane A2 serving as the second layer and arranged between the circuit units 45 in the first column and the circuit units 45 in the second column. Similarly, the collector wiring line C2 serving as the second layer and connected to the collectors of the HBTs 41 of the plurality of circuit units 45 in the third column and the fourth column is continuous with a conductive plane A2 serving as the second layer and arranged between the circuit units 45 in the third column and the circuit units 45 in the fourth column.

The emitter wiring line E1 serving as the first layer and connected to the emitters of the HBTs 41 of the plurality of circuit units 45 in the first column and the second column is continuous with a conductive plane A1 serving as the first layer and arranged between the circuit units 45 in the first column and the circuit units 45 in the second column. Similarly, the emitter wiring line E1 serving as the first layer and connected to the emitters of the HBTs 41 of the plurality of circuit units 45 in the third column and the fourth column is continuous with a conductive plane A1 serving as the first layer and arranged between the circuit units 45 in the third column and the circuit units 45 in the fourth column.

The two conductive planes A2 serving as the second layer are continuous with a pad P2 constituted by the metal wiring line layer serving as the second layer. A protective film is disposed on the metal wiring line layer serving as the second layer. A plurality of openings 47 are formed in the protective film. The upper surface of the pad P2 is exposed in the openings 47. The conductive planes A1 serving as the first layer are connected through via-holes 48 formed in the semiconductor substrate to a ground plane provided on a back surface of a semiconductor substrate.

An RF input wiring line I2 is arranged on the metal wiring line layer serving as the second layer, and a bias wiring line M1 is arranged on the metal wiring line layer serving as the first layer. The RF input wiring line I2 has a comb shape having four comb teeth and is arranged such that the four comb-tooth portions are disposed along the corresponding columns of the circuit units 45. The RF input wiring line I2 intersects the base wiring line B1, and this intersecting portion operates as the input capacitor 42. The base wiring line B1 is connected to the bias wiring line M1 with the ballast resistor 43 therebetween.

Figure 3:
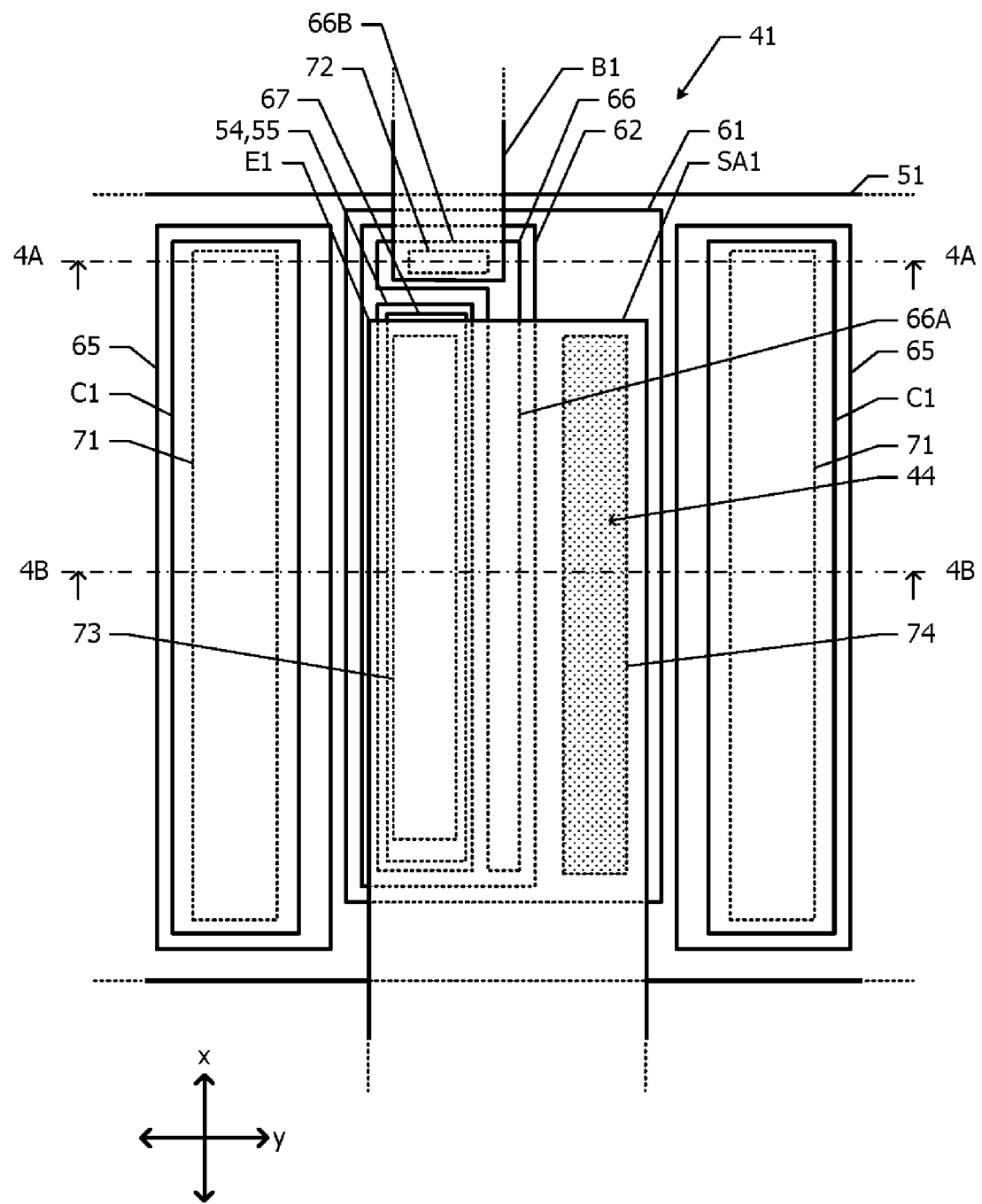
FIG. 3 is a plan view of a semiconductor device according to the first embodiment.
Figure 4A:
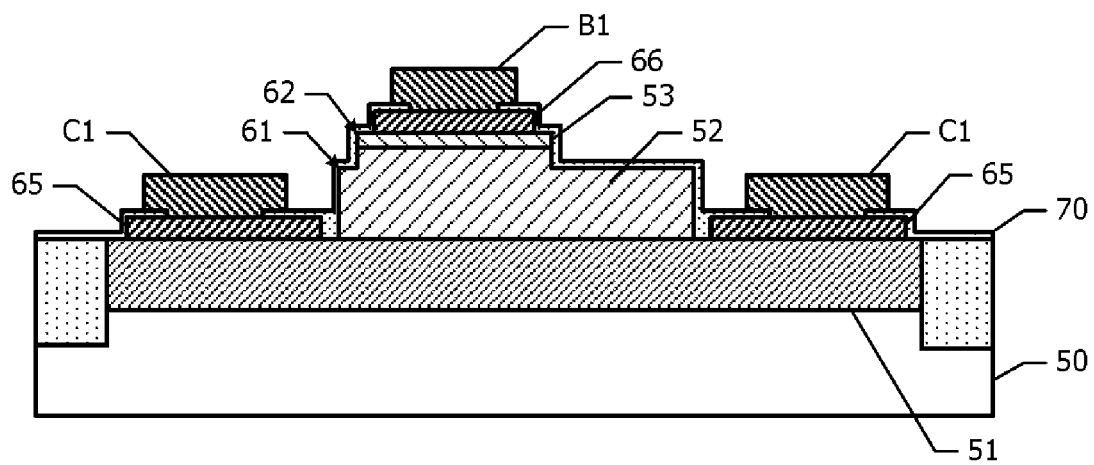
FIG. 4A is a sectional view taken along the dash-dotted line 4A-4A of FIG. 3.
Figure 4B:
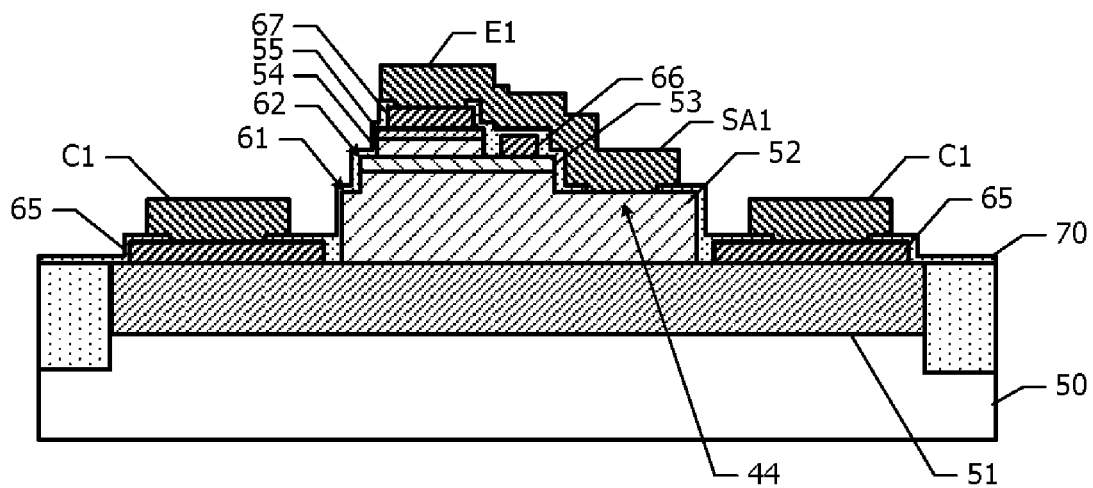
FIG. 4B is a sectional view taken along the dash-dotted line 4B-4B of FIG. 3.

FIG. 3 is a plan view of one HBT 41. FIG. 4A is a sectional view taken along the dash-dotted line 4A-4A of FIG. 3, and FIG. 4B is a sectional view taken along the dash-dotted line 4B-4B of FIG. 3. FIG. 3 and FIGS. 4A and 4B illustrate the structure of the metal wiring line layer serving as the first layer and thereunder and does not illustrate the metal wiring line layer serving as the second layer, for example, the collector wiring line C2 (FIG. 2). A description will be made with reference to FIG. 3 and FIGS. 4A and 4B.

A sub-collector layer 51 formed of n$^+$-type GaAs is formed on an upper surface of a semiconductor substrate 50 formed of semi-insulating GaAs. The sub-collector layer 51 is partially subjected to ion implantation with H or He to have an insulating property. The resulting insulating region divides the sub-collector layer 51 into a plurality of n$^+$-type conductive regions. Hereinafter, each of the n$^+$-type conductive regions is simply referred to as a "sub-collector layer 51". Four HBTs 41 arrayed in the column direction and illustrated in FIG. 2 are arranged in one sub-collector layer 51 divided by the insulating region.

A collector layer 52, a base layer 53, an emitter layer 54, and an emitter contact layer 55 are sequentially epitaxially grown on the sub-collector layer 51. The collector layer 52 is formed of n$^-$-type GaAs having a lower carrier concentration than the sub-collector layer 51. The base layer 53 is formed of p-type GaAs. The emitter layer 54 is formed of n-type InGaP. The emitter contact layer 55 has a two-layer structure including an n-type GaAs layer and an n-type InGaAs layer.

A two-layer portion of the collector layer 52 and the base layer 53 is processed so as to have a double mesa shape. A first mesa portion 61 of a lower step includes a lower portion of the collector layer 52. A second mesa portion 62 formed on the first mesa portion 61 includes an upper portion of the collector layer 52 and the base layer 53. The emitter layer 54 and the emitter contact layer 55 are formed on a partial region of the second mesa portion 62.

A collector electrode 65 is disposed on the sub-collector layer 51. The collector electrode 65 is constituted by two conductor portions arranged on both sides of the first mesa portion 61. The conductor portions constituting the collector electrode 65 have a three-layer structure including a AuGe layer, a Ni layer, and a Au layer and are ohmically connected to the sub-collector layer 51. A base electrode 66 is arranged on the base layer 53 of the second mesa portion 62. The base electrode 66 has a three-layer structure including a Ti layer, a Pt layer, and a Au layer and is ohmically connected to the base layer 53. An emitter electrode 67 is arranged on the emitter contact layer 55. The emitter electrode 67 has a four-layer structure including a Mo layer, a Ti layer, a Pt layer, and a Au layer and is ohmically connected to the emitter contact layer 55.

The pair of conductor portions constituting the collector electrode 65 and the emitter electrode 67 each have a planar shape that is long in one direction (corresponding to a longitudinal direction in FIG. 3, and hereinafter, referred to as an "x direction" (first direction)). The base electrode 66 has an L-shaped planar shape. One linear portion (hereinafter, referred to as a "main portion 66A") of the L letter is arranged to be parallel to the x direction. The other linear portion (hereinafter, referred to as an "extended portion 66B") extends in a direction (hereinafter, referred to as a "y direction" (second direction)) orthogonal to the x direction.

An interlayer insulating film 70 formed of silicon nitride covers the sub-collector layer 51, the collector layer 52, the base layer 53, the emitter layer 54, the emitter contact layer 55, the collector electrode 65, the base electrode 66, and the emitter electrode 67. Contact holes 71 are formed in the interlayer insulating film 70 so as to correspond to the pair of conductor portions constituting the collector electrode 65. Contact holes 72 and 73 are respectively formed in the interlayer insulating film 70 so as to correspond to the extended portion 66B of the base electrode 66 and the emitter electrode 67. Furthermore, a contact hole 74 is formed in the interlayer insulating film 70 in a region of the upper surface of the first mesa portion 61, the region not having the second mesa portion 62 thereon.

On the interlayer insulating film 70, a collector wiring line C1, a base wiring line B1, an emitter wiring line E1, and a first Schottky electrode SA1 are arranged as a metal wiring line layer serving as a first layer. These wiring lines may be formed of Au. These wiring lines may have a two-layer structure including a Ti layer and a Au layer or a two-layer structure including a Mo layer and a Au layer. The collector wiring line C1 is connected through the contact holes 71 to the collector electrode 65. The base wiring line B1 is connected through the contact hole 72 to the base electrode 66. The emitter wiring line E1 is connected through the contact hole 73 to the emitter electrode 67.

The first Schottky electrode SA1 forms a Schottky junction to the collector layer 52 through the contact hole 74. The first Schottky electrode SA1 and the collector layer 52 form a Schottky junction-type protection diode 44. In FIG. 3, a Schottky junction region of the protection diode 44 is shown by the dot pattern. The collector layer 52 functions as a semiconductor region on the cathode side of the protection diode 44. The first Schottky electrode SA1 is continuous with the emitter wiring line E1. The first Schottky electrode SA1 and the emitter wiring line E1 are constituted by a continuous film arranged in the metal wiring line layer serving as the first layer. In other words, the first Schottky electrode SA1 is a part of the emitter wiring line E1.

The protection diode 44 has a planar shape that is long in a direction parallel to the longitudinal direction of the emitter electrode 67 and the collector electrode 65. The emitter electrode 67, the main portion 66A of the base electrode 66, and the protection diode 44 are arranged side by side in the y direction. In plan view, the protection diode 44, the base electrode 66, and the emitter electrode 67 are arranged in a region flanked in the y direction between the pair of conductor portions constituting the collector electrode 65 (hereinafter, referred to as a "base-emitter arrangement region"). The collector layer 52 of the HBT 41 and the semiconductor region functioning as the cathode of the protection diode 44 are included in the first mesa portion 61 that is used in common, and no insulating region is provided between the collector layer 52 of the HBT 41 and the semiconductor region.

Since the first Schottky electrode SA1 is disposed over the main portion 66A of the base electrode 66 and continuous with the emitter wiring line E1, the base wiring line B1 serving as the first layer cannot be arranged on the main portion 66A of the base electrode 66. For this reason, the contact hole 72 is formed at a position corresponding to the extended portion 66B of the base electrode 66, and the base wiring line B1 is connected to the extended portion 66B of the base electrode 66.

Next, a method for producing a semiconductor device according to the first embodiment will be briefly described with reference to FIGS. 4A and 4B.

First, on the semiconductor substrate 50 formed of semi-insulating GaAs, layers from the sub-collector layer 51 to the emitter contact layer 55 are sequentially epitaxially grown by metalorganic vapor phase epitaxy (MOVPE). The upper surface of the semiconductor substrate 50 has, for example, a plane orientation of (001) and an off-angle of ±4° or less.

The HBT 41 and the protection diode 44 are formed by using a typical semiconductor process. Etching for forming the second mesa portion 62 is stopped by time control at the time when etching proceeds to a deeper position than the interface between the base layer 53 and the collector layer 52. Alternatively, an etching-stop layer formed of InGaP or the like may be arranged between the collector layer 52 and the base layer 53, and the etching may be stopped by the etching-stop layer. After the etching is stopped by the etching-stop layer, the etching-stop layer is selectively removed. In this case, the upper surface of the first mesa portion 61 is substantially flush with the interface between the collector layer 52 and the base layer 53.

Subsequently, the interlayer insulating film 70, and, as a first layer, the collector wiring line C1, the base wiring line B1, the emitter wiring line E1, and the first Schottky electrode SA1 are formed. Furthermore, an interlayer insulating film, a metal wiring line layer serving as a second layer, and a protective film are formed. Subsequently, a sapphire substrate is bonded on the protective film by using wax or the like. In this state, the via-holes 48 (FIG. 2) are formed from the back surface of the semiconductor substrate 50. After the formation of the via-holes 48, a back-side metal is formed on the back surface of the semiconductor substrate 50. The wax and the sapphire substrate are removed from the semiconductor substrate 50. Subsequently, the semiconductor substrate 50 is, for example, cut with a dicing machine to be separated into chips.

Next, advantageous effects of the semiconductor device according to the first embodiment will be described in comparison with semiconductor devices according to comparative examples illustrated in FIGS. 26 to 29.

FIGS. 26 and 27 are respectively a plan view and a sectional view of a semiconductor device according to a comparative example. Hereafter, configurations that are different from the semiconductor device according to the first embodiment will be described, and descriptions of common configurations will be omitted. In the first embodiment, the protection diode 44 (FIGS. 3 and 4B) is arranged in the base-emitter arrangement region between the pair of conductor portions constituting the collector electrode 65 of the HBT 41. In other words, the protection diode 44 is incorporated in the HBT 41.

In contrast, in the comparative example illustrated in FIGS. 26 and 27, a protection diode 44 is arranged in a region different from a region where an HBT 41 is arranged. The protection diode 44 (FIG. 27) is constituted by a p-n junction at the interface between a collector layer 52 and a base layer 53. The collector layer 52 and the base layer 53 of the HBT 41 have a single mesa structure.

An anode electrode 68 is formed on the base layer 53 of the protection diode 44. A cathode electrode 69 is formed on a sub-collector layer 51 connected to the collector layer 52 of the protection diode 44.

A conductive plane A1 that serves as the first layer and that is continuous with an emitter wiring line E1 extends onto a mesa portion 63 for a diode and is connected to the anode electrode 68. Furthermore, a collector wiring line C1 functioning as the first layer is connected to the cathode electrode 69 of the protection diode 44. The sub-collector layer 51 on which the HBT 41 is arranged and the sub-collector layer 51 on which the protection diode 44 is arranged are electrically insulated from each other by an insulating region 56 (FIG. 27) formed by ion implantation.

As illustrated in FIG. 28, only a partial region of a collector layer 52, the partial region having a collector electrode 65 and a cathode electrode 69 thereon, may be etched to expose a sub-collector layer 51. In this case, an insulating region 56 is formed in both the collector layer 52 and the sub-collector layer 51.

Figure 29:
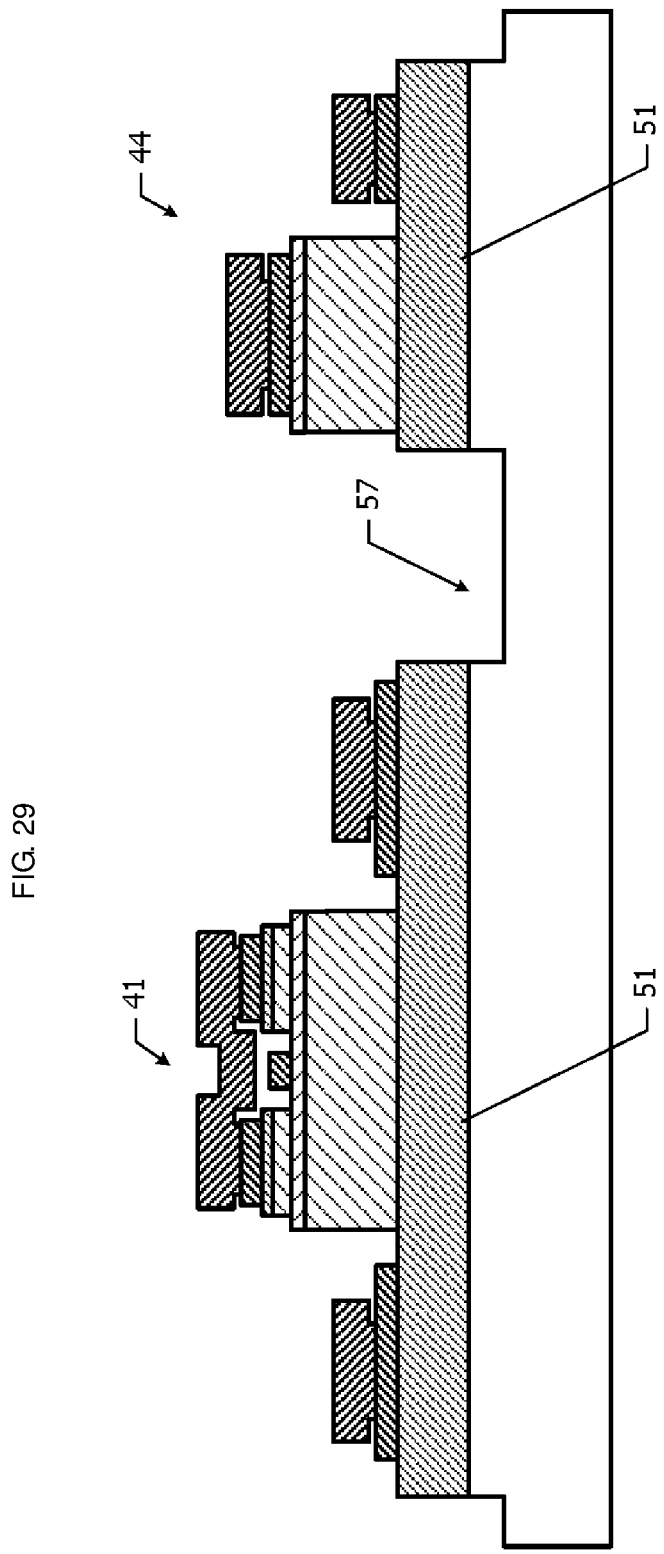
FIG. 29 is a sectional view of a semiconductor device according to still another comparative example.

As illustrated in FIG. 29, a trench 57 that isolates a sub-collector layer 51 on which an HBT 41 is arranged from a sub-collector layer 51 on which a protection diode 44 is arranged may be formed.

In the first embodiment, since the HBT 41 and the protection diode 44 are formed in the first mesa portion 61 that is used in common, it is not necessary to secure a region where the mesa portion 63 (FIG. 27) for a diode is arranged. Furthermore, it is not necessary to arrange the insulating region 56 (FIGS. 27 and 28) or the trench 57 (FIG. 29) that isolates the sub-collector layer 51 on which the HBT 41 is arranged from the sub-collector layer 51 on which the protection diode 44 is arranged. Therefore, miniaturization of the semiconductor device can be achieved.

Next, modifications of the first embodiment will be described. In the first embodiment, the protection diode 44 is arranged for each of the HBTs 41. Alternatively, the protection diode 44 may be arranged only for some of the sixteen HBTs 41.

In the first embodiment, as illustrated in FIGS. 4A and 4B, the first mesa portion 61 including the collector layer 52 is formed in a region where the HBT 41 and the protection diode 44 are arranged. As another configuration, for example, as illustrated in FIG. 28, the collector layer 52 located in a region where the collector electrode 65 is to be formed may be removed, and the collector layer 52 located in another region may be left. Of the remaining collector layer 52, a region that should have insulating properties is subjected to ion implantation.

In the first embodiment, GaAs is used as the collector layer 52 and the base layer 53 of the HBT 41, and InGaP is used as the emitter layer 54. Alternatively, other semiconductors may be used. The HBT 41 may be replaced by an ordinary bipolar transistor. In the first embodiment, the HBT 41 is an n-p-n-type transistor. Alternatively, the HBT 41 may be a p-n-p-type transistor. Furthermore, an ohmic contact layer and a channel layer of a source and a drain may be added between the semiconductor substrate 50 and the sub-collector layer 51 to constitute a BiFET.

Second Embodiment

Figure 6A:
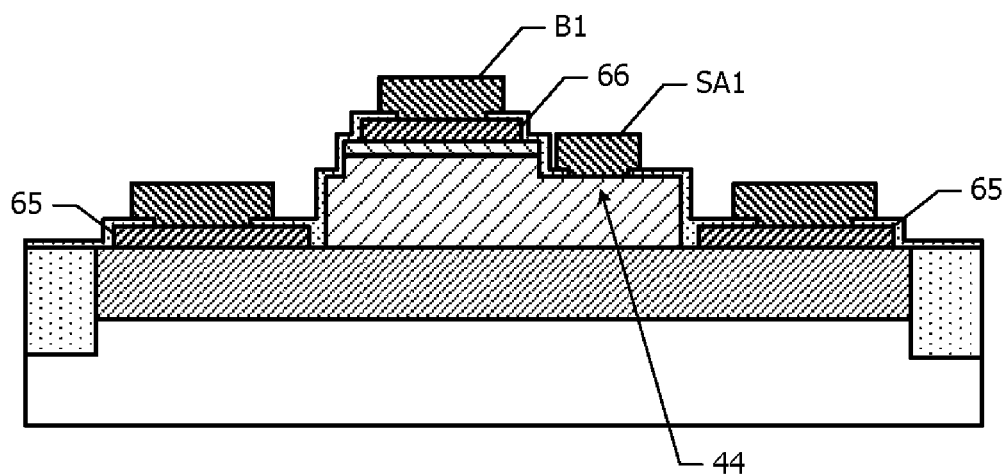
FIG. 6A is a sectional view taken along the dash-dotted line 6A-6A of FIG. 5.
Figure 6B:
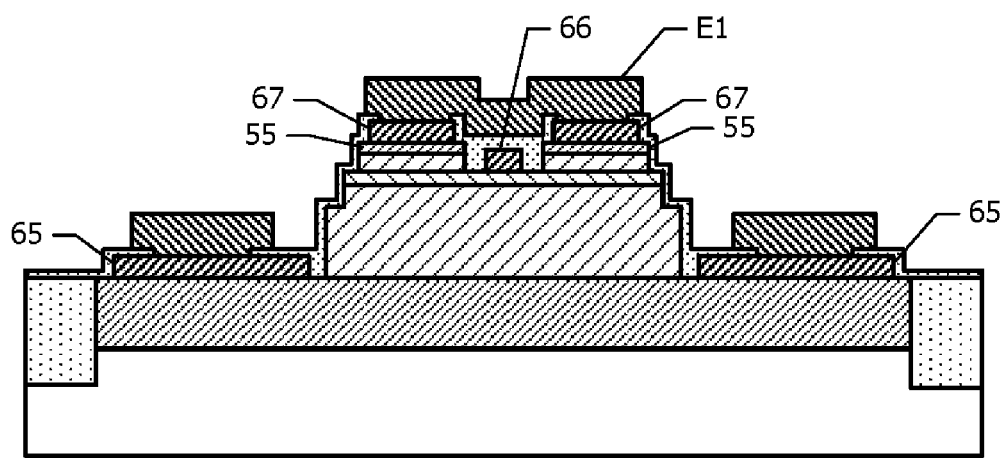
FIG. 6B is a sectional view taken along the dash-dotted line 6B-6B of FIG. 5.

Next, a semiconductor device according to a second embodiment will be described with reference to FIG. 5 and FIGS. 6A and 6B. Hereinafter, descriptions of configurations that are common to the semiconductor device according to the first embodiment will be omitted.

FIG. 5 is a plan view of one HBT 41 of a semiconductor device according to the second embodiment. FIG. 6A is a sectional view taken along the dash-dotted line 6A-6A of FIG. 5, and FIG. 6B is a sectional view taken along the dash-dotted line 6B-6B of FIG. 5.

Comparing the first embodiment and the second embodiment, the layout of the emitter electrode 67, the base electrode 66, and the protection diode 44 is different. In the first embodiment, as illustrated in FIG. 3, the emitter electrode 67, the main portion 66A of the base electrode 66, and the protection diode 44 are arranged side by side in the y direction. Furthermore, the emitter electrode 67, the base electrode 66, and the protection diode 44 are arranged in the base-emitter arrangement region flanked between the pair of the conductor portions constituting the collector electrode 65.

In the second embodiment, an emitter electrode 67 is constituted by a pair of conductor portions arranged apart from each other in the y direction. Each of the conductor portions has a planar shape that is long in the x direction. A main portion 66A of a base electrode 66 is arranged between the pair of conductor portions constituting the emitter electrode 67. The pair of conductor portions constituting the emitter electrode 67 are connected to each other by an emitter wiring line E1 (FIG. 6B) arranged so as to extend over the base electrode 66. A protection diode 44 including a first Schottky electrode SA1 is arranged at a position apart in the x direction with respect to one of the conductor portions (conductor portion on the right side in FIG. 5) of the emitter electrode 67. A portion where the base electrode 66 is connected to a base wiring line B1 (FIG. 6A), and the protection diode 44 are arranged side by side in the y direction. The first Schottky electrode SA1 is continuous with the emitter wiring line E1.

Also in the second embodiment, the protection diode 44 is incorporated in the HBT 41 as in the first embodiment, and thus an advantageous effect of miniaturization of the semiconductor device is achieved. In addition, in the second embodiment, a ratio of the area occupied by the base electrode 66 to the contact area (emitter area) between an emitter contact layer 55 (FIG. 6B) and the emitter electrode 67 (FIG. 6B) is low. In the case where the total emitter area of all the circuit units 45 (FIG. 1B) of the semiconductor device according to the first embodiment is equal to the total emitter area of all the circuit units 45 of the semiconductor device according to the second embodiment, the parasitic capacitance of the base-collector junction of the second embodiment is lower than that in the first embodiment. Accordingly, the adoption of the configuration of the semiconductor device according to the second embodiment enables an improvement in the performance of the semiconductor device.

Third Embodiment

Next, a semiconductor device according to a third embodiment will be described with reference to FIG. 7 and FIGS. 8A and 8B. Hereinafter, descriptions of configurations that are common to the semiconductor device according to the second embodiment will be omitted.

Figure 7:
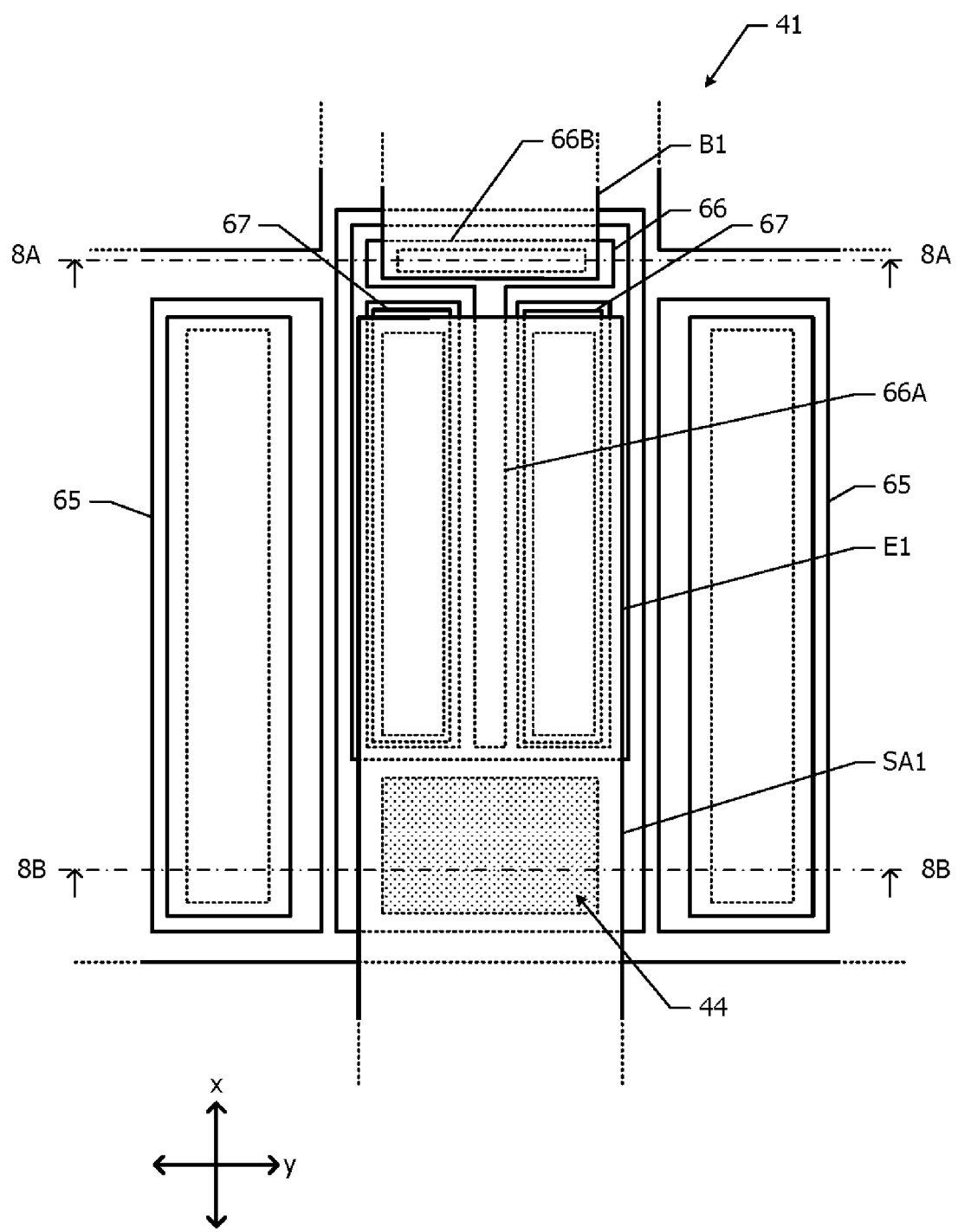
FIG. 7 is a plan view of a semiconductor device according to a third embodiment.
Figure 8A:
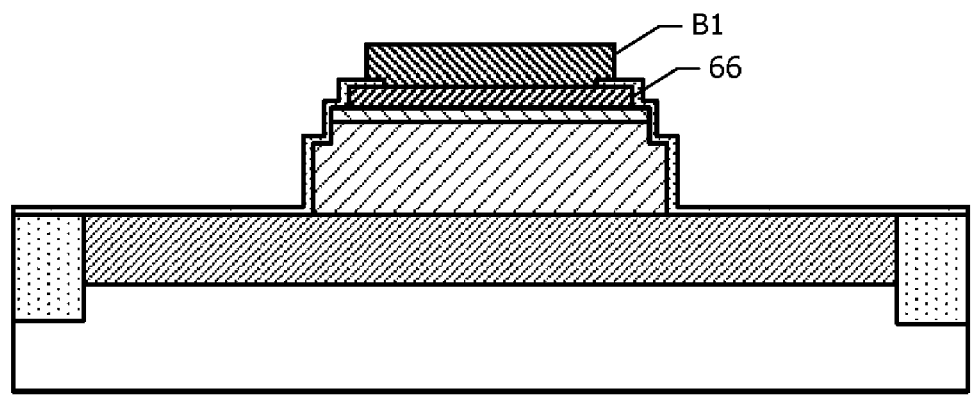
FIG. 8A is a sectional view taken along the dash-dotted line 8A-8A of FIG. 7.
Figure 8B:
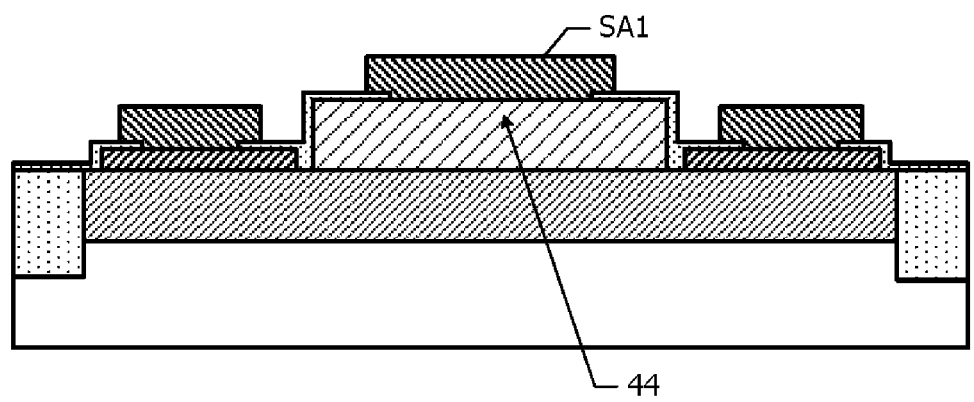
FIG. 8B is a sectional view taken along the dash-dotted line 8B-8B of FIG. 7.

FIG. 7 is a plan view of one HBT 41 of a semiconductor device according to the third embodiment. FIG. 8A is a sectional view taken along the dash-dotted line 8A-8A of FIG. 7, and FIG. 8B is a sectional view taken along the dash-dotted line 8B-8B of FIG. 7.

In the second embodiment, the base electrode 66 (FIG. 5) has an L-shaped planar shape including a main portion 66A and an extended portion 66B, and the extended portion 66B and the protection diode 44 are arranged side by side in the y direction.

In contrast, in the third embodiment, a base electrode 66 has a T-shaped planar shape. Specifically, a main portion 66A extends, in the right-angle direction (x direction), from substantially the center of a linear extended portion 66B that is long in the y direction. A pair of conductor portions constituting an emitter electrode 67 are arranged on both sides of the main portion 66A. A protection diode 44 is arranged on the opposite side of the extended portion 66B with respect to the region where the emitter electrode 67 and the main portion 66A are arranged. That is, a portion (extended portion 66B) where the base electrode 66 is connected to a base wiring line B1, the emitter electrode 67, and the protection diode 44 are arranged in this order in the x direction. An emitter wiring line E1 on the emitter electrode 67 is continuous with the conductive plane A1 (FIG. 2) serving as the first layer with a first Schottky electrode SA1 (FIG. 8B) therebetween.

Also in the third embodiment, miniaturization of the semiconductor device can be achieved as in the first and second embodiments. Furthermore, in the third embodiment, since the portion where the base electrode 66 is connected to the base wiring line B1, and the protection diode 44 are not arranged side by side in the y direction, the portion where the base electrode 66 is connected to the base wiring line B1 can be made long in the y direction. Similarly, a Schottky junction region of the protection diode 44 can be made long in the y direction.

Fourth Embodiment

Next, a semiconductor device according to a fourth embodiment will be described with reference to FIGS. 9 to 11B. Hereinafter, descriptions of configurations that are common to the semiconductor device according to the first embodiment will be omitted.

Figure 9:
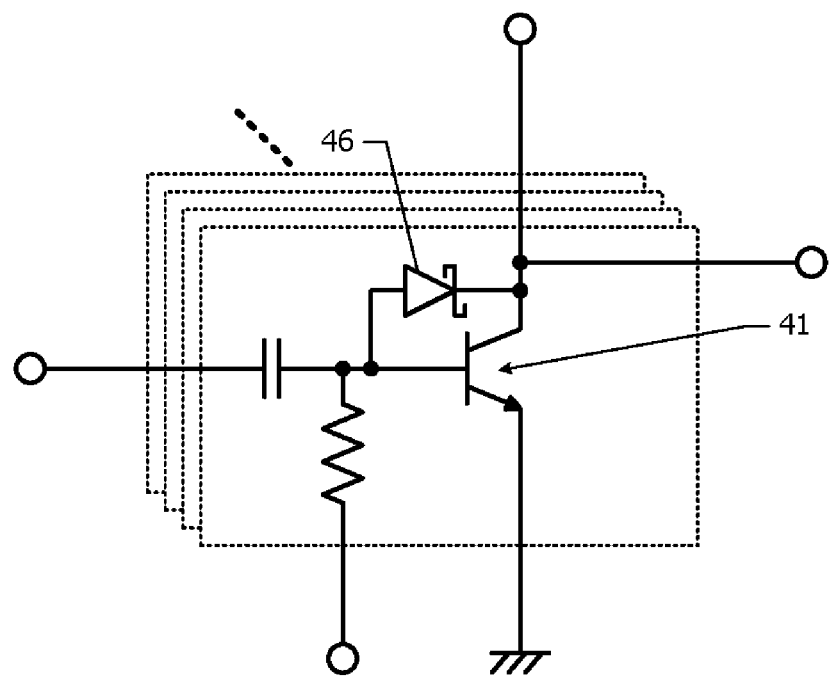
FIG. 9 is an equivalent circuit diagram of an output-stage amplifier circuit of a power amplifier module including a semiconductor device according to a fourth embodiment.

FIG. 9 is an equivalent circuit diagram of an output-stage amplifier circuit 33 (FIG. 1A) of a power amplifier module including a semiconductor device according to the fourth embodiment. In the first embodiment, the protection diode 44 (FIG. 1B) is connected between the emitter and the collector of the HBT 41. In the fourth embodiment, a protection diode 46 is connected between the base and the collector of an HBT 41. The protection diode 46 has a function of conducting electricity when a negative voltage relative to the base of the HBT 41 is applied to the collector to thereby protect the HBT 41.

Figure 10:
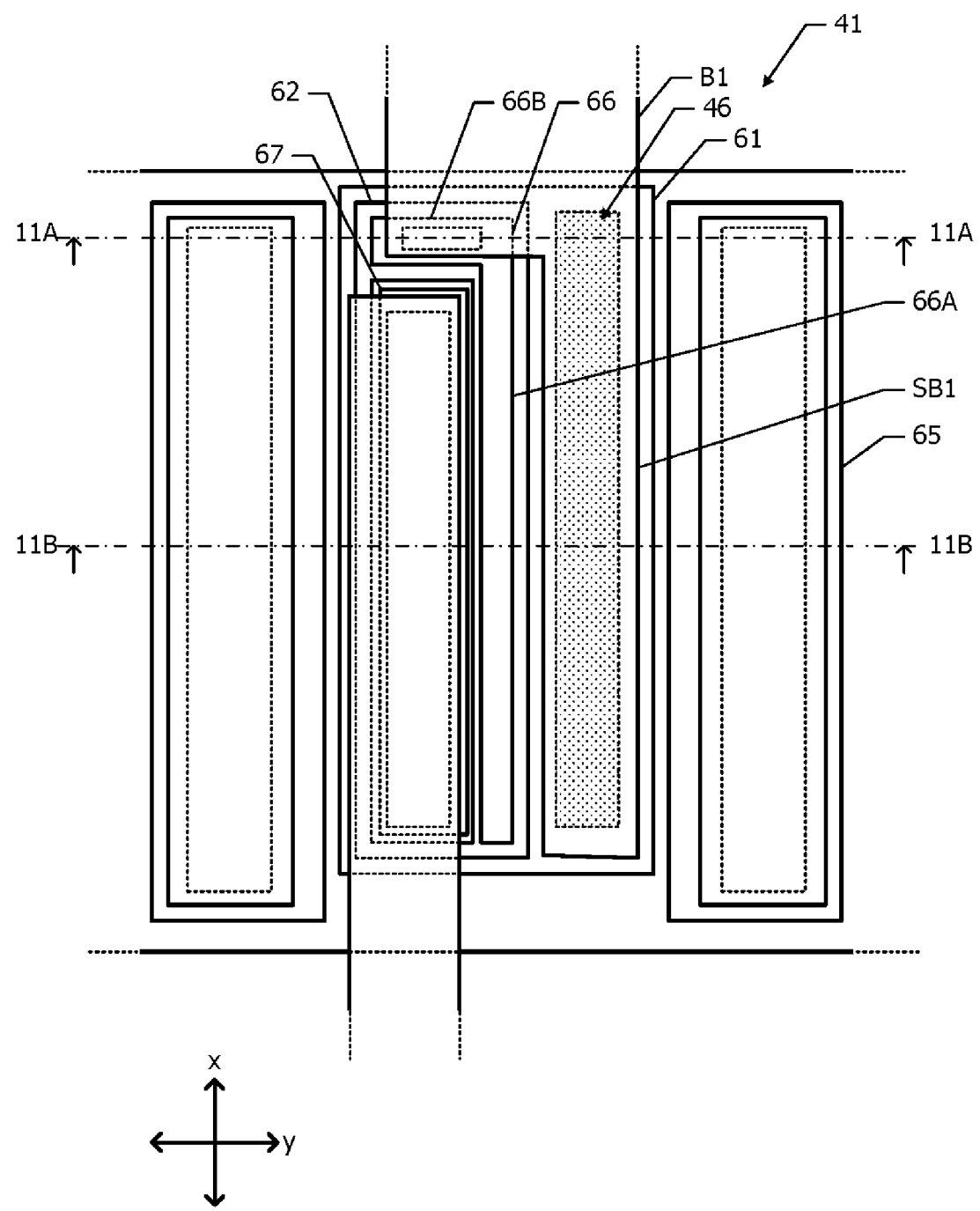
FIG. 10 is a plan view of a semiconductor device according to the fourth embodiment.
Figure 11A:
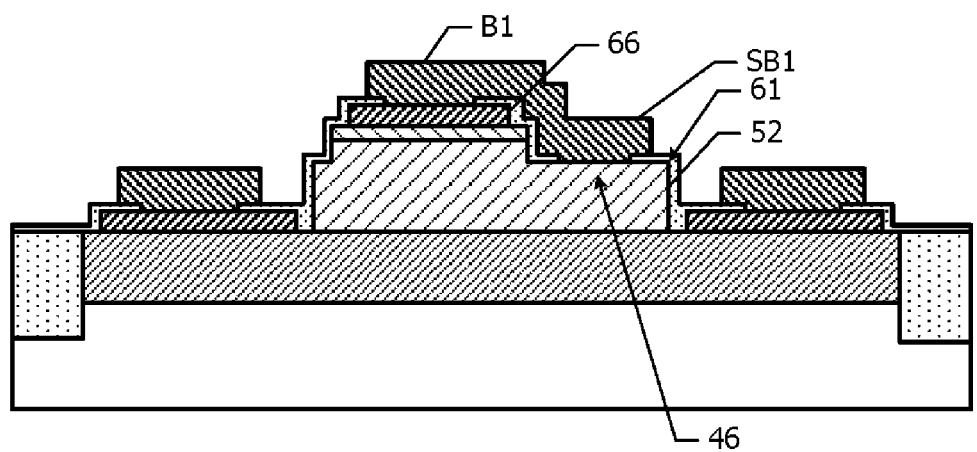
FIG. 11A is a sectional view taken along the dash-dotted line 11A-11A of FIG. 10.
Figure 11B:
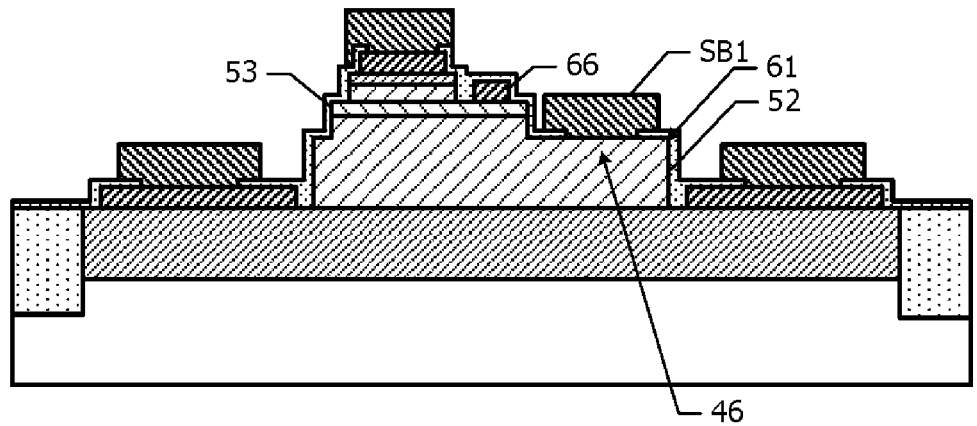
FIG. 11B is a sectional view taken along the dash-dotted line 11B-11B of FIG. 10.

FIG. 10 is a plan view of one HBT 41 of a semiconductor device according to the fourth embodiment. FIG. 11A is a sectional view taken along the dash-dotted line 11A-11A of FIG. 10, and FIG. 11B is a sectional view taken along the dash-dotted line 11B-11B of FIG. 10. A second Schottky electrode SB1 forms a Schottky junction to an upper surface of a collector layer 52 of a first mesa portion 61. The second Schottky electrode SB1 and the collector layer 52 form the Schottky junction-type protection diode 46. In FIG. 10, a region where a Schottky junction is formed is shown by the dot pattern.

The second Schottky electrode SB1 is continuous with a base wiring line B1 on the section illustrated in FIG. 11A. On the section illustrated in FIG. 11B, a base electrode 66 is arranged on a base layer 53, however, the base wiring line B1 (FIG. 11A) is not arranged thereon. The base electrode 66 is connected to the base wiring line B1 in an extended portion 66B. An emitter electrode 67, a main portion 66A of the base electrode 66, and the protection diode 46 are arranged side by side in the y direction. The main portion 66A of the base electrode 66 is arranged between the emitter electrode 67 and the protection diode 46.

Next, advantageous effects of the semiconductor device according to the fourth embodiment will be described. Also in the fourth embodiment, since the protection diode 46 is incorporated in the HBT 41, miniaturization of the semiconductor device can be achieved.

Fifth Embodiment

Next, a semiconductor device according to a fifth embodiment will be described with reference to FIG. 12 and FIGS. 13A and 13B. Hereinafter, descriptions of configurations that are common to the semiconductor device according to the fourth embodiment will be omitted.

Figure 12:
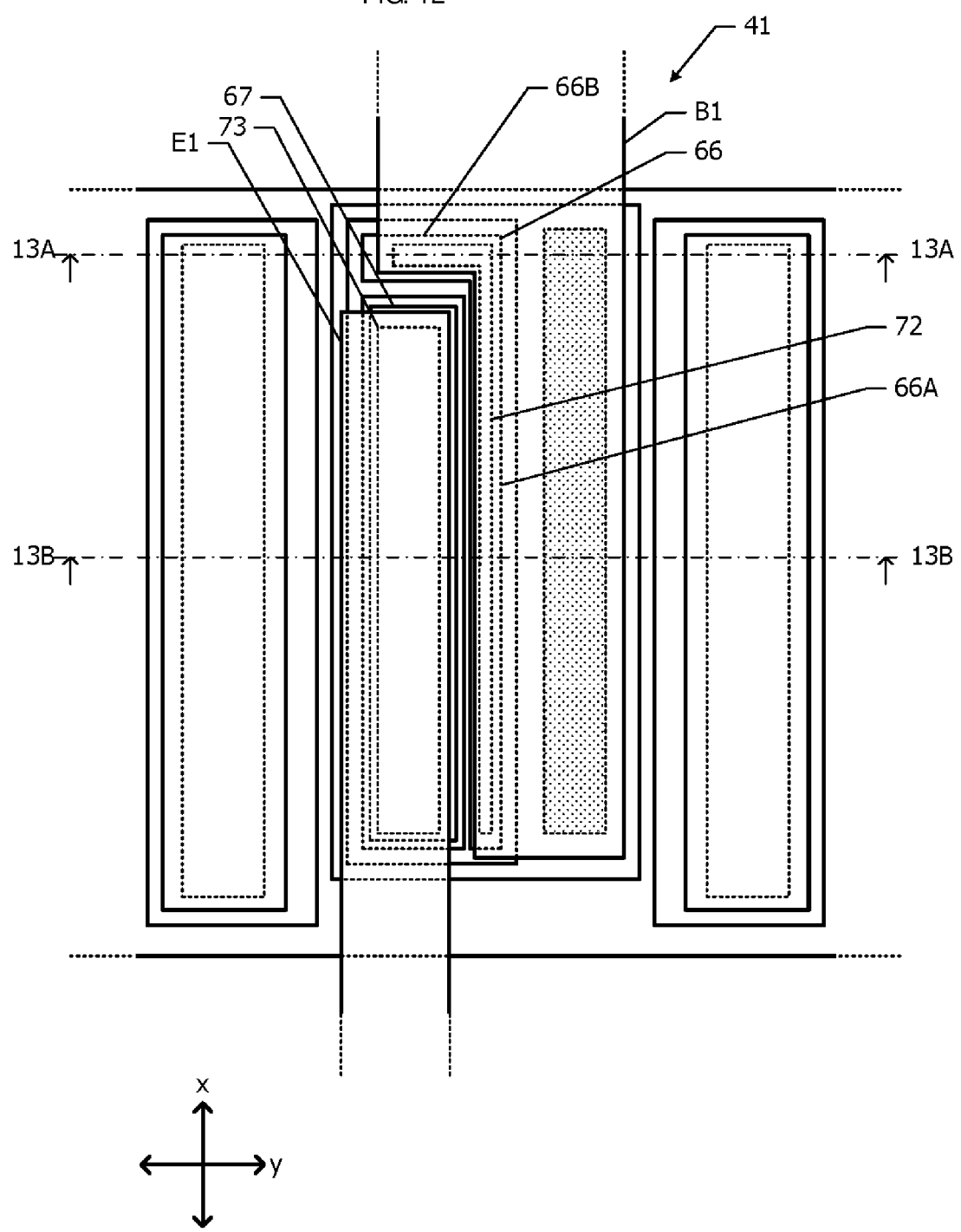
FIG. 12 is a plan view of a semiconductor device according to a fifth embodiment.
Figure 13A:
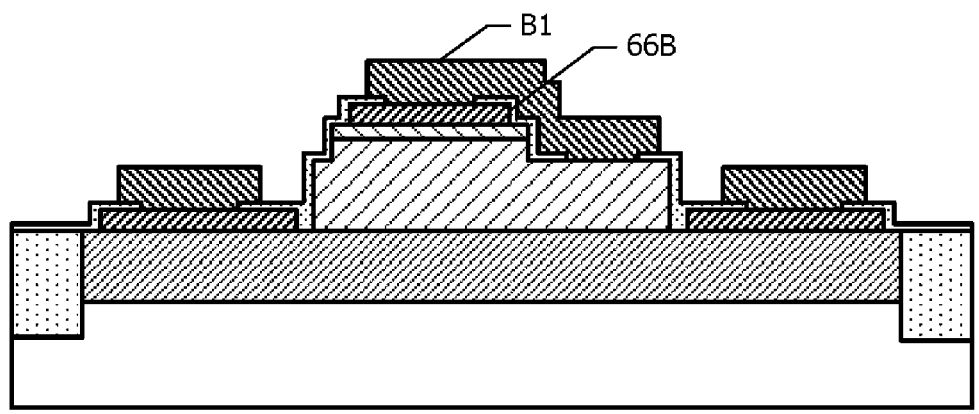
FIG. 13A is a sectional view taken along the dash-dotted line 13A-13A of FIG. 12.
Figure 13B:
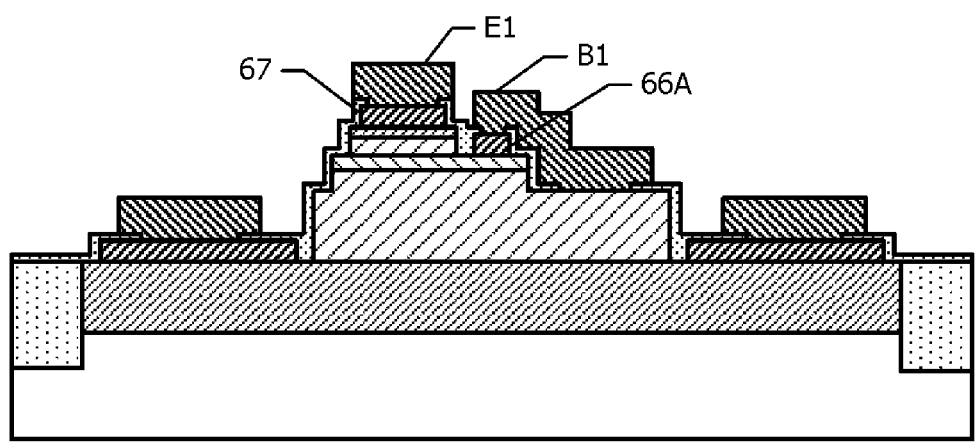
FIG. 13B is a sectional view taken along the dash-dotted line 13B-13B of FIG. 12.

FIG. 12 is a plan view of one HBT 41 of a semiconductor device according to the fifth embodiment. FIG. 13A is a sectional view taken along the dash-dotted line 13A-13A of FIG. 12, and FIG. 13B is a sectional view taken along the dash-dotted line 13B-13B of FIG. 12. In the fourth embodiment, the L-shaped base electrode 66 is connected to the base wiring line B1 (FIGS. 10 and 11A) in the extended portion 66B. The base wiring line B1 is not arranged on the main portion 66A (FIG. 11B) of the base electrode 66.

In contrast, in the fifth embodiment, the base wiring line B1 is arranged also on a main portion 66A (FIG. 13B) of a base electrode 66. A contact hole 72 for connecting the base electrode 66 to the base wiring line B1 is arranged along the main portion 66A and an extended portion 66B and has an L-shaped planar shape conforming to the shape of the base electrode 66. With this configuration, both the extended portion 66B (FIG. 13A) and the main portion 66A (FIG. 13B) of the base electrode 66 are connected to the base wiring line B1 arranged directly thereon. A contact hole 73 for connecting an emitter electrode 67 to an emitter wiring line E1 is also arranged along the emitter electrode 67 that is long in the x direction.

The semiconductor device according to the fifth embodiment has, in addition to the advantageous effect of the semiconductor device according to the fourth embodiment, an advantageous effect that the base parasitic resistance of the HBT 41 is reduced.

Sixth Embodiment

Next, a semiconductor device according to a sixth embodiment will be described with reference to FIG. 14 and FIGS. 15A and 15B. Hereinafter, descriptions of configurations that are common to the semiconductor device according to the fourth embodiment (FIG. 10) will be omitted.

Figure 14:
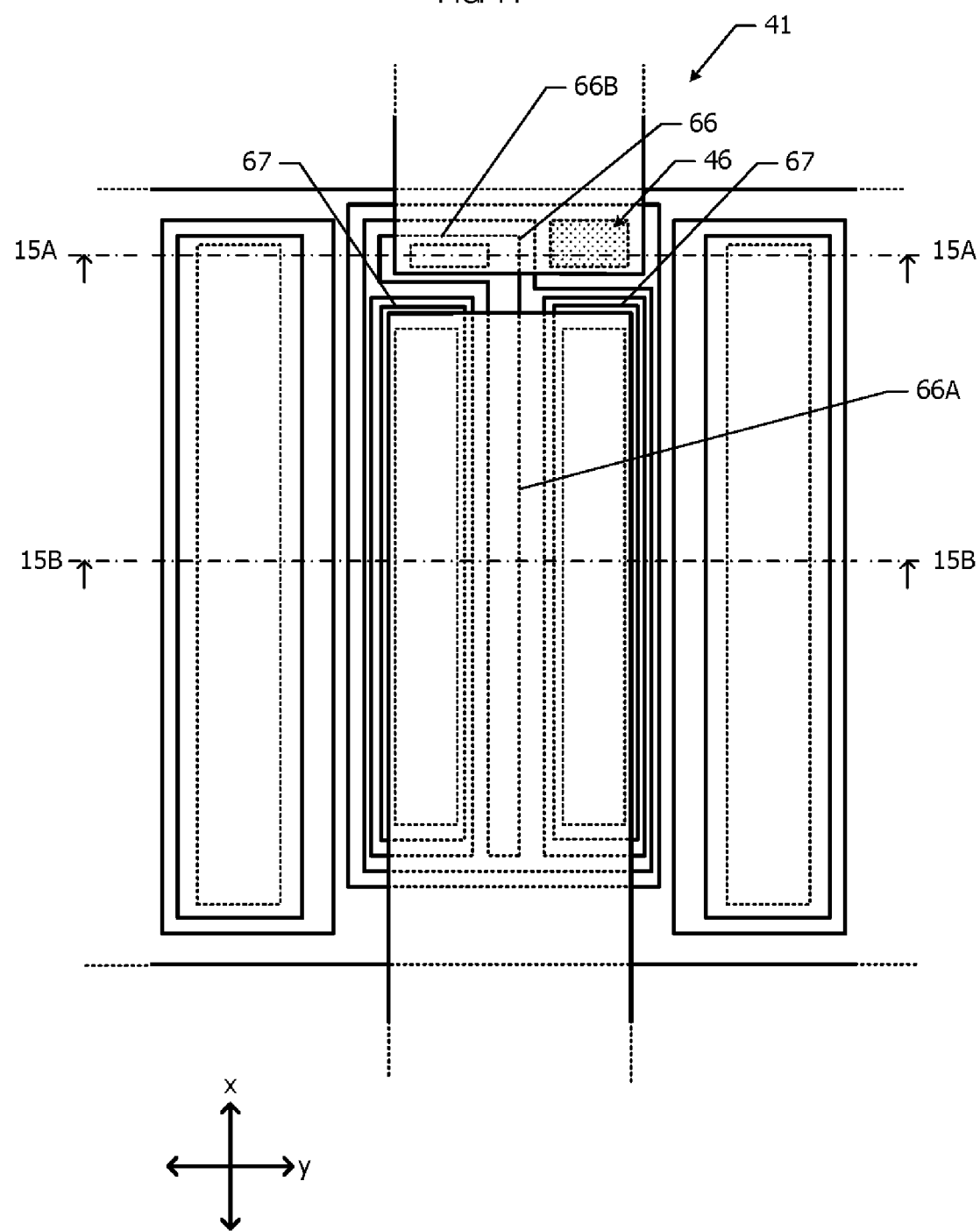
FIG. 14 is a plan view of a semiconductor device according to a sixth embodiment.
Figure 15A:
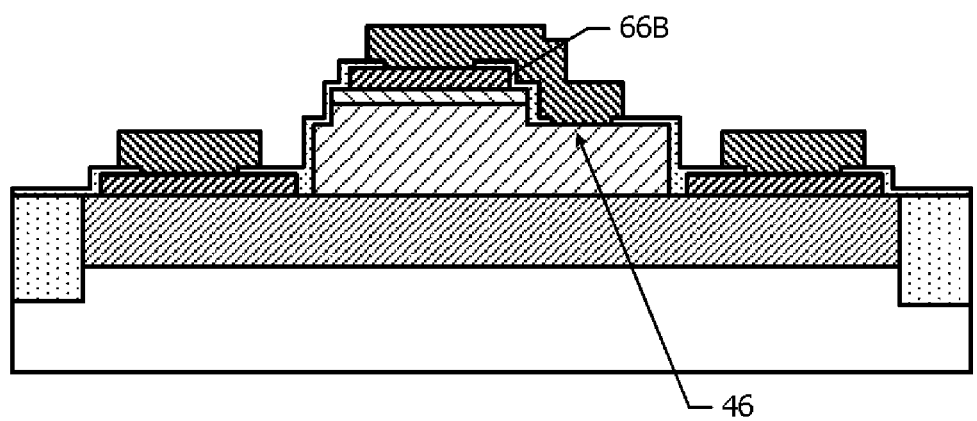
FIG. 15A is a sectional view taken along the dash-dotted line 15A-15A of FIG. 14.
Figure 15B:
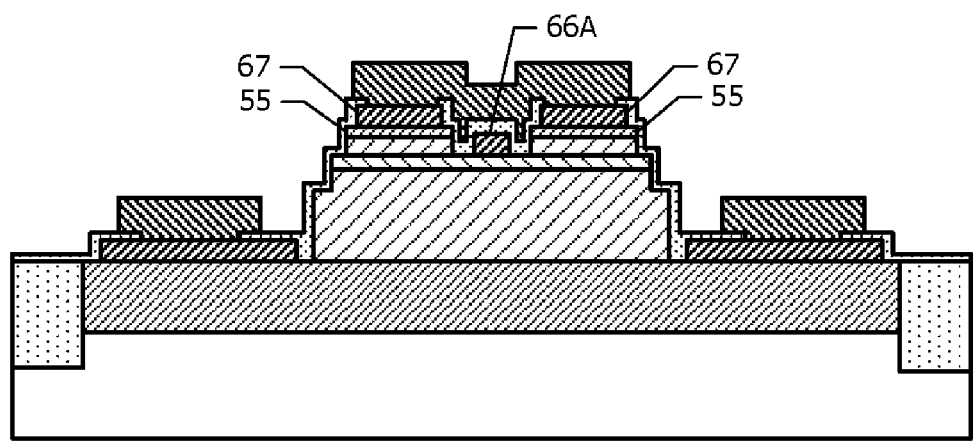
FIG. 15B is a sectional view taken along the dash-dotted line 15B-15B of FIG. 14.

FIG. 14 is a plan view of one HBT 41 of a semiconductor device according to the sixth embodiment. FIG. 15A is a sectional view taken along the dash-dotted line 15A-15A of FIG. 14, and FIG. 15B is a sectional view taken along the dash-dotted line 15B-15B of FIG. 14. In the fourth embodiment (FIG. 10), the emitter electrode 67 is arranged on one side of the main portion 66A of the base electrode 66, and the protection diode 46 is arranged on the other side. In contrast, in the sixth embodiment, conductor portions constituting an emitter electrode 67 are arranged on both sides of a main portion 66A (FIG. 14 and FIG. 15B) of a base electrode 66. A protection diode 46 is arranged at a position where an extension of an extended portion 66B of the base electrode 66 in the y direction intersects an extension of one of the conductor portions of the emitter electrode 67 in the x direction.

In the semiconductor device according to the sixth embodiment, a ratio of the area occupied by the base electrode 66 to the emitter area is smaller than that of the semiconductor device according to the fourth embodiment. Therefore, as in the case of the second embodiment (FIG. 5), the parasitic capacitance of the base-collector junction per unit emitter area is reduced. Accordingly, the adoption of the configuration of the semiconductor device according to the sixth embodiment enables an improvement in the performance.

Seventh Embodiment

Next, a semiconductor device according to a seventh embodiment will be described with reference to FIG. 16 and FIGS. 17A and 17B. Hereinafter, descriptions of configurations that are common to the semiconductor device according to the sixth embodiment (FIG. 14) will be omitted.

Figure 16:
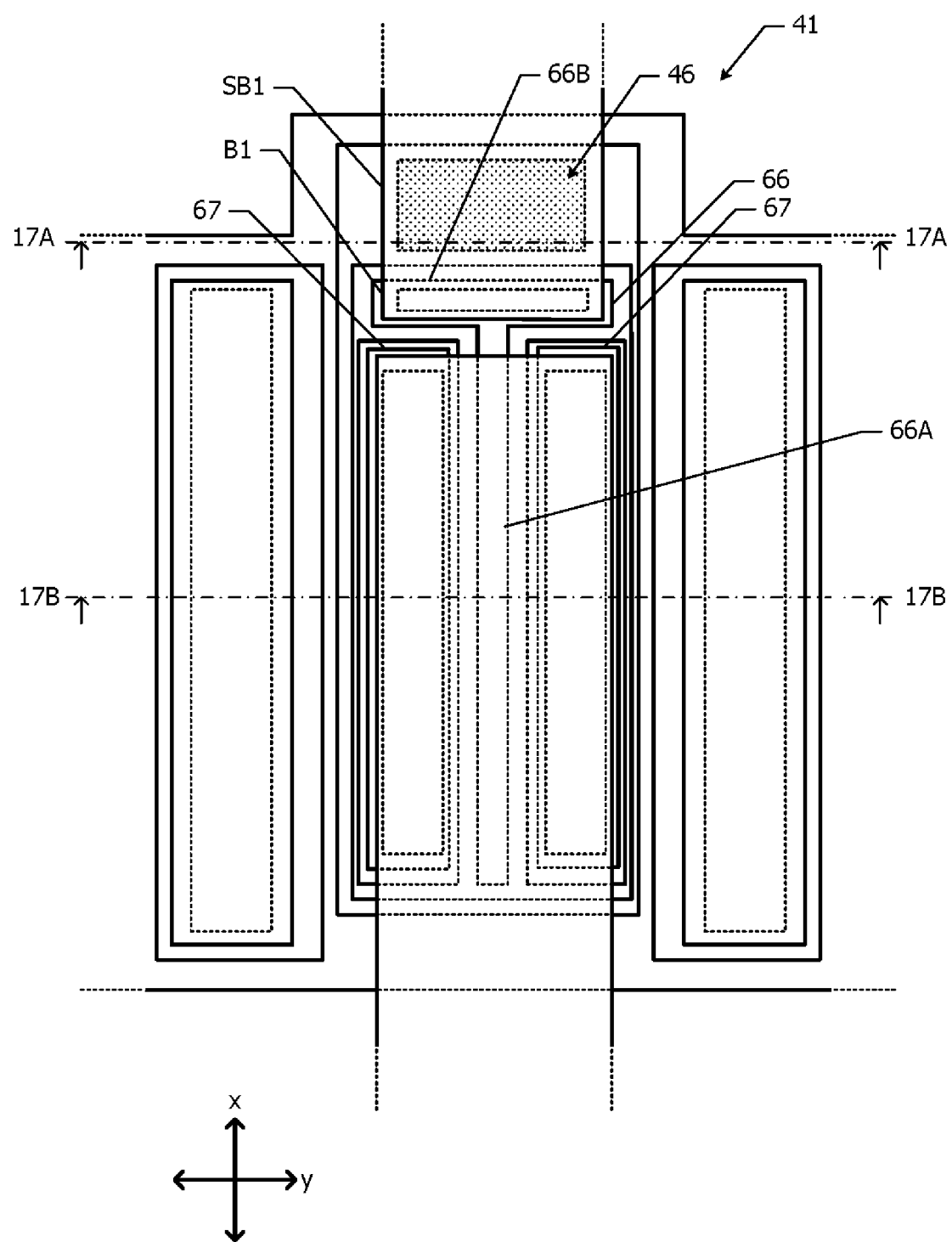
FIG. 16 is a plan view of a semiconductor device according to a seventh embodiment.
Figure 17A:
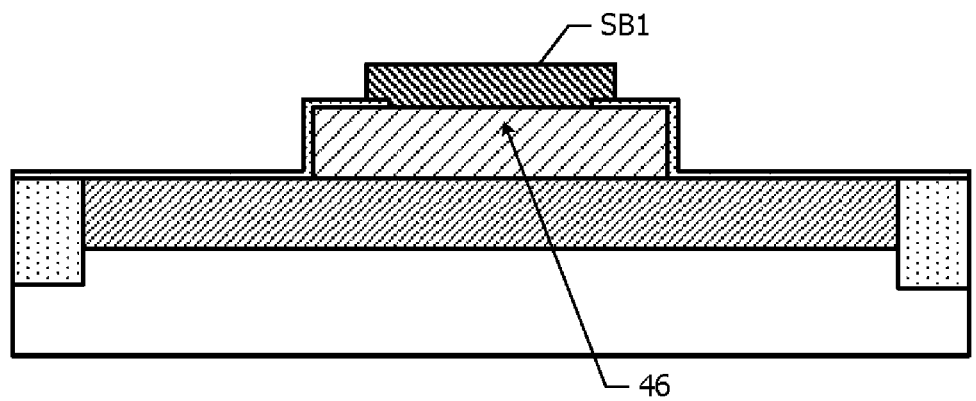
FIG. 17A is a sectional view taken along the dash-dotted line 17A-17A of FIG. 16.
Figure 17B:
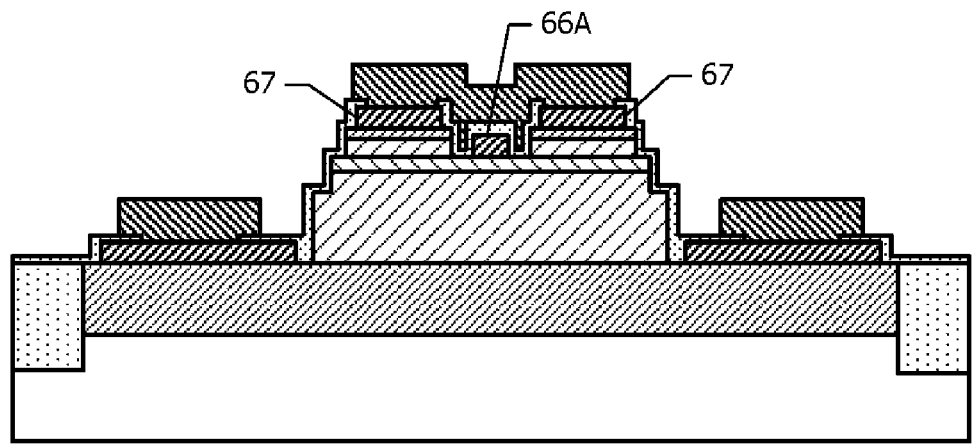
FIG. 17B is a sectional view taken along the dash-dotted line 17B-17B of FIG. 16.

FIG. 16 is a plan view of one HBT 41 of a semiconductor device according to the seventh embodiment. FIG. 17A is a sectional view taken along the dash-dotted line 17A-17A of FIG. 16, and FIG. 17B is a sectional view taken along the dash-dotted line 17B-17B of FIG. 16. In the sixth embodiment (FIG. 14), the extended portion 66B of the L-shaped base electrode 66 and the protection diode 46 are arranged side by side in the y direction.

In contrast, in the seventh embodiment, a base electrode 66 has a T-shaped planar shape. A main portion 66A extends, in the right-angle direction (x direction), from substantially the center of a linear extended portion 66B that is long in the y direction. A protection diode 46 is arranged on the opposite side of the direction in which the main portion 66A extends with respect to the extended portion 66B. Conductor portions constituting an emitter electrode 67 are arranged on both side of the main portion 66A (FIG. 17B). A base wiring line B1 connected to the extended portion 66B of the base electrode 66 is connected to the input capacitor 42 (FIG. 2) with a second Schottky electrode SB1 of the protection diode 46 therebetween.

In the seventh embodiment, the contact area between the base electrode 66 and the base wiring line B1 can be made larger than that in the sixth embodiment (FIG. 14). Furthermore, the area of the Schottky junction region of the protection diode 46 can be made large.

Eighth Embodiment

Next, a semiconductor device according to an eighth embodiment will be described with reference to FIGS. 18 to 20B. Hereinafter, descriptions of configurations that are common to the semiconductor device according to the first embodiment will be omitted.

Figure 18:
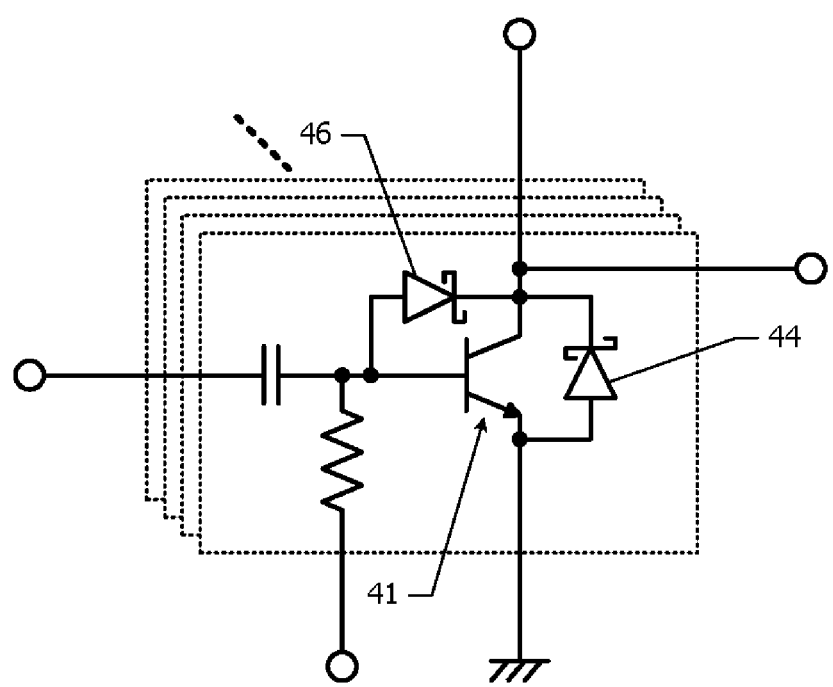
FIG. 18 is an equivalent circuit diagram of an output-stage amplifier circuit of a power amplifier module including a semiconductor device according to an eighth embodiment.

FIG. 18 is an equivalent circuit diagram of an output-stage amplifier circuit 33 (FIG. 1A) of a power amplifier module including a semiconductor device according to the eighth embodiment. In the first embodiment, the protection diode 44 (FIG. 1B) is connected between the emitter and the collector of the HBT 41. In the eighth embodiment, in addition to a protection diode 44, another protection diode 46 is connected between the base and the collector of an HBT 41. The protection diode 46 has a function of conducting electricity when a negative voltage relative to the base of the HBT 41 is applied to the collector to thereby protect the HBT 41.

Figure 20A:
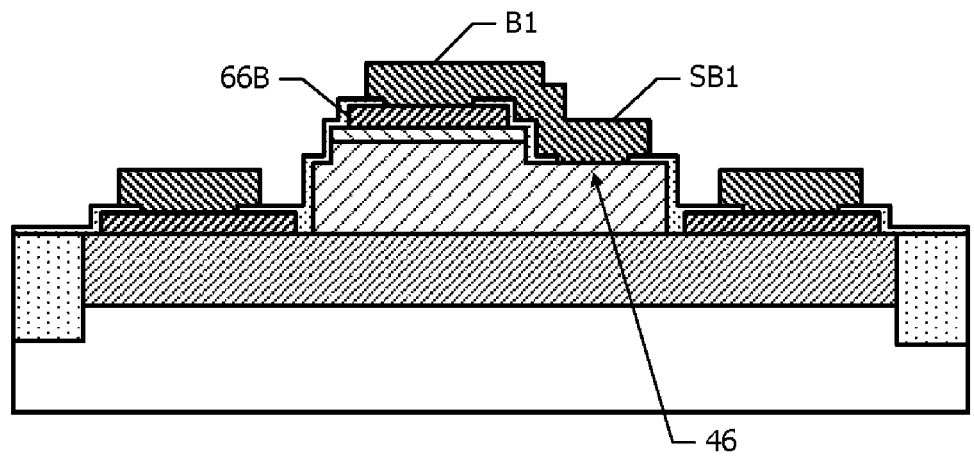
FIG. 20A is a sectional view taken along the dash-dotted line 20A-20A of FIG. 19.
Figure 20B:
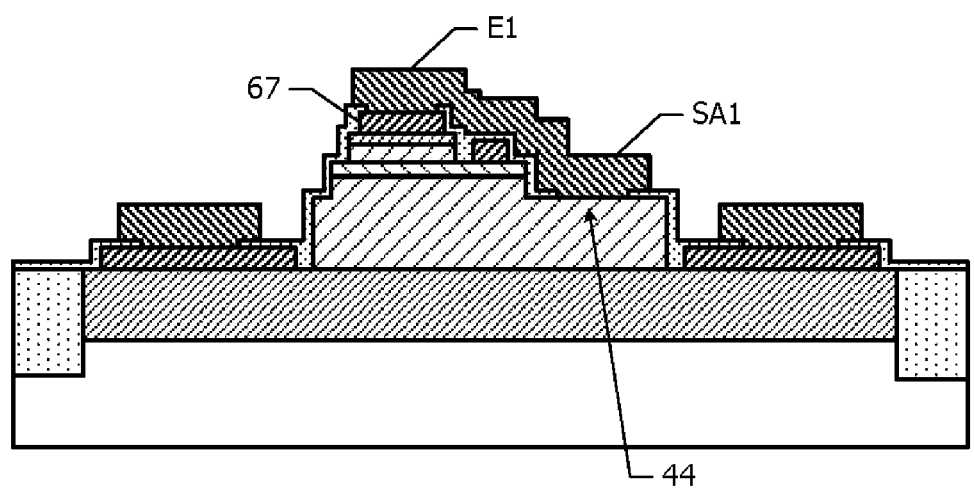
FIG. 20B is a sectional view taken along the dash-dotted line 20B-20B of FIG. 19.

FIG. 19 is a plan view of one HBT 41 of a semiconductor device according to the eighth embodiment. FIG. 20A is a sectional view taken along the dash-dotted line 20A-20A of FIG. 19, and FIG. 20B is a sectional view taken along the dash-dotted line 20B-20B of FIG. 19. An emitter electrode 67 is arranged on one side of a main portion 66A of a base electrode 66 as a center, and the protection diodes 44 and 46 are arranged on the other side. Specifically, the one protection diode 44 is arranged at a position corresponding to the protection diode 44 (FIG. 3) of the semiconductor device according to the first embodiment, and the other protection diode 46 is arranged at a position corresponding to the protection diode 46 (FIG. 10) of the semiconductor device according to the fourth embodiment.

The one protection diode 44 and the other protection diode 46 are aligned in the x direction. With respect to the x direction, the protection diode 46 is arranged on the extended portion 66B side, and the protection diode 44 is arranged on the leading end side of the main portion 66A.

A second Schottky electrode SB1 of the protection diode 46 (FIG. 20A) is continuous with a base wiring line B1 connected to the extended portion 66B. A first Schottky electrode SA1 of the protection diode 44 (FIG. 20B) is continuous with an emitter wiring line E1 connected to the emitter electrode 67.

In the eighth embodiment, the HBT 41 can be protected from an overvoltage between the emitter and the collector of the HBT 41 and an overvoltage between the base and the collector thereof. Furthermore, since the two protection diodes 44 and 46 are incorporated in the HBT 41, miniaturization of the semiconductor device can be achieved.

Ninth Embodiment

Figure 22A:
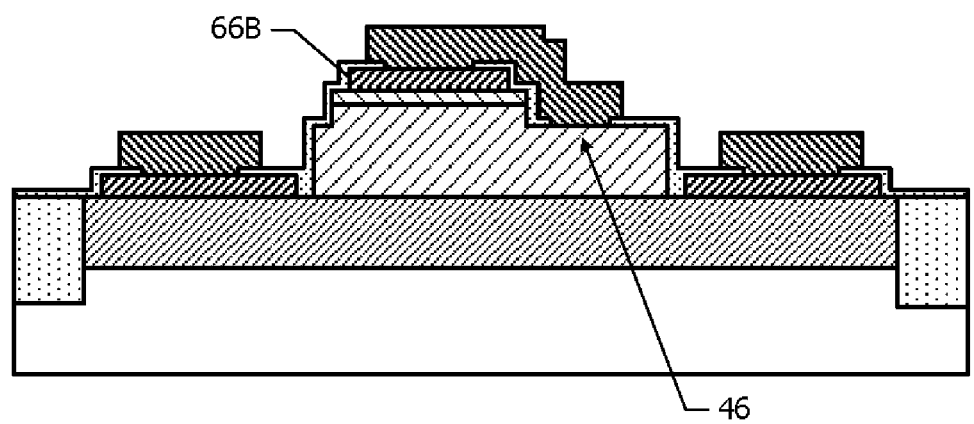
FIG. 22A is a sectional view taken along the dash-dotted line 22A-22A of FIG. 21.
Figure 22B:
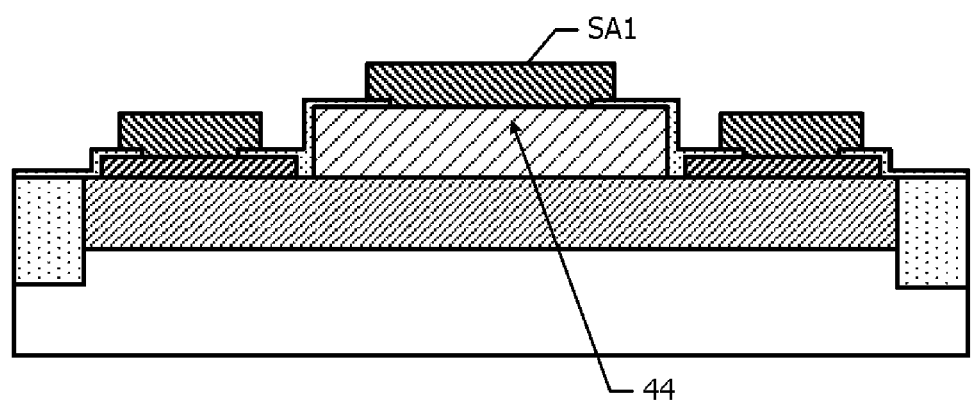
FIG. 22B is a sectional view taken along the dash-dotted line 22B-22B of FIG. 21.

Next, a semiconductor device according to a ninth embodiment will be described with reference to FIG. 21 and FIGS. 22A and 22B. Hereinafter, descriptions of configurations that are common to the semiconductor device according to the eighth embodiment (FIG. 18) will be omitted.

FIG. 21 is a plan view of one HBT 41 of a semiconductor device according to the ninth embodiment. FIG. 22A is a sectional view taken along the dash-dotted line 22A-22A of FIG. 21, and FIG. 22B is a sectional view taken along the dash-dotted line 22B-22B of FIG. 21. In the eighth embodiment (FIG. 19), the emitter electrode 67 is arranged only on the one side of the main portion 66A of the base electrode 66. In the ninth embodiment, conductor portions constituting an emitter electrode 67 are arranged on both sides of a main portion 66A.

One protection diode 44 is arranged at a position apart from the emitter electrode 67 and a base electrode 66 in the x direction. That is, the positional relationship of the base electrode 66, the emitter electrode 67 and the protection diode 44 is the same as the positional relationship of those in the semiconductor device (FIG. 7) according to the third embodiment. The sectional structure illustrated in FIG. 22B is the same as the sectional structure illustrated in FIG. 8B of the third embodiment.

Another protection diode 46 is arranged at a position where an extension of an extended portion 66B of the base electrode 66 in the y direction intersects an extension of one of the conductor portions of the emitter electrode 67 in the x direction. That is, the positional relationship of the base electrode 66, the emitter electrode 67, and the protection diode 46 is the same as the positional relationship of those in the semiconductor device (FIG. 14) according to the sixth embodiment. The sectional structure illustrated in FIG. 22A is the same as the sectional structure illustrated in FIG. 15A of the sixth embodiment.

In the ninth embodiment, a ratio of the area occupied by the base electrode 66 to the emitter area is smaller than that of the eighth embodiment. Therefore, as in the case of the second embodiment (FIG. 5), the parasitic capacitance of the base-collector junction per unit emitter area is reduced. Accordingly, the adoption of the configuration of the semiconductor device according to the ninth embodiment enables an improvement in the performance.

Tenth Embodiment

Next, a semiconductor device according to a tenth embodiment will be described with reference to FIG. 23 and FIGS. 24A and 24B. Hereinafter, descriptions of configurations that are common to the semiconductor device according to the ninth embodiment (FIG. 21) will be omitted.

Figure 23:
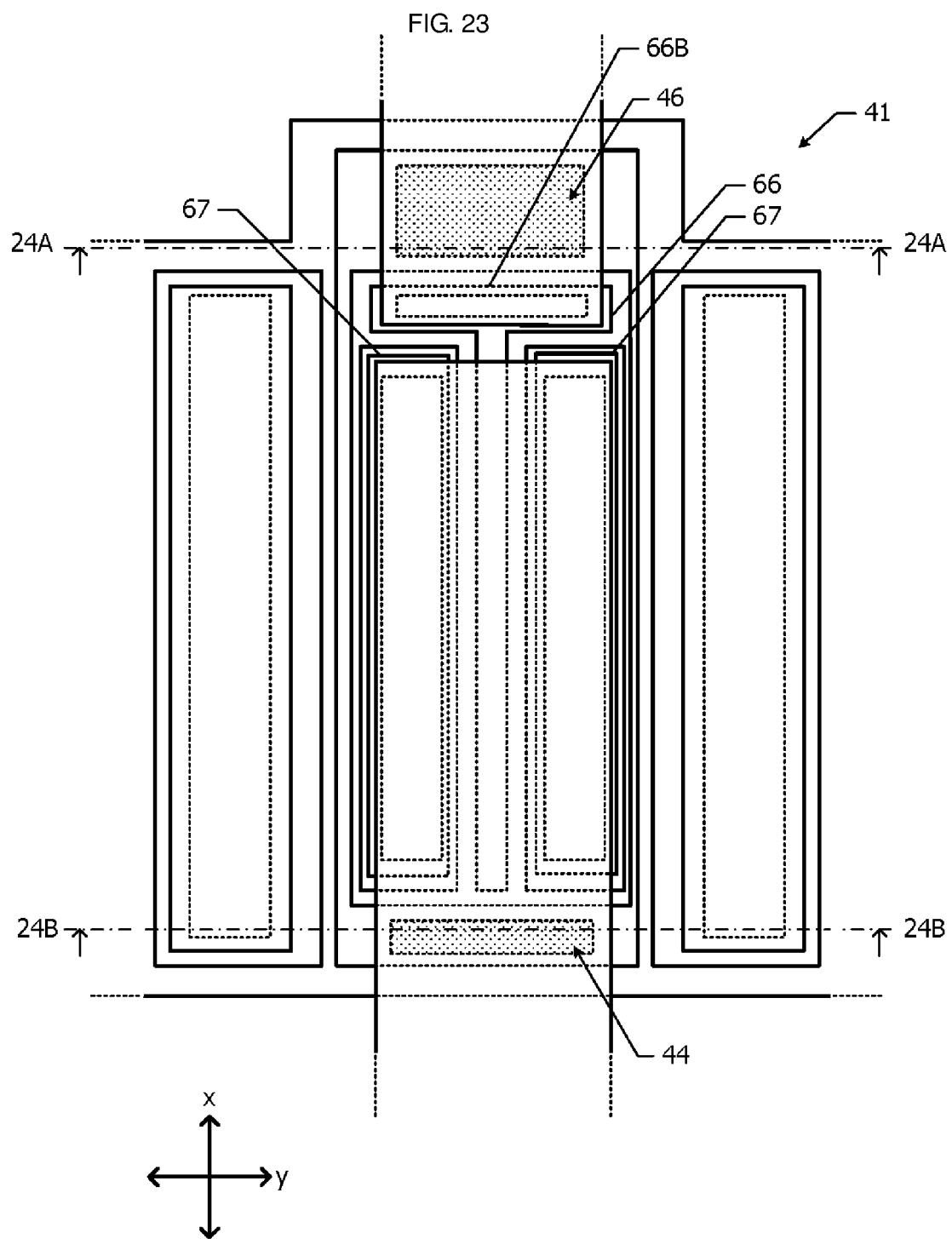
FIG. 23 is a plan view of a semiconductor device according to a tenth embodiment.
Figure 24A:
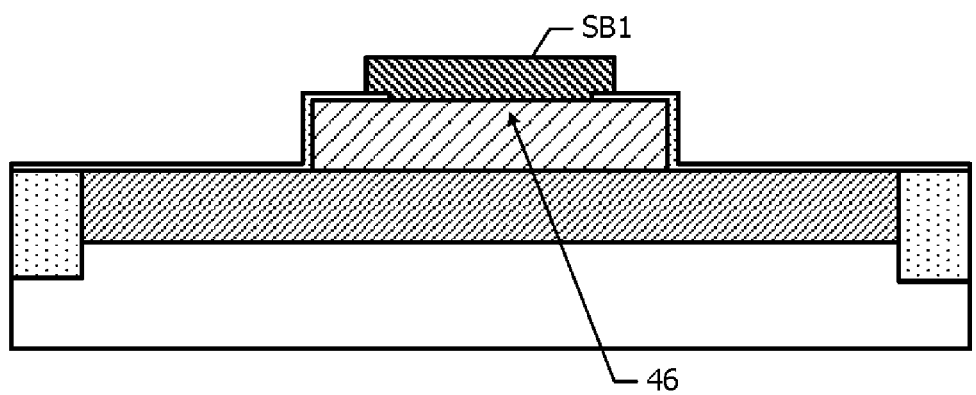
FIG. 24A is a sectional view taken along the dash-dotted line 24A-24A of FIG. 23.
Figure 24B:
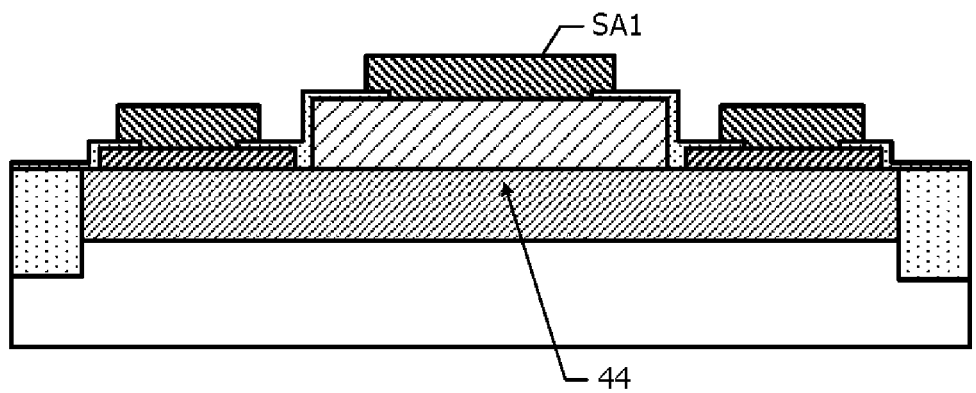
FIG. 24B is a sectional view taken along the dash-dotted line 24B-24B of FIG. 23.

FIG. 23 is a plan view of one HBT 41 of a semiconductor device according to the tenth embodiment. FIG. 24A is a sectional view taken along the dash-dotted line 24A-24A of FIG. 23, and FIG. 24B is a sectional view taken along the dash-dotted line 24B-24B of FIG. 23. In the ninth embodiment (FIG. 21), the extended portion 66B of the L-shaped base electrode 66 and the protection diode 46 are arranged side by side in the y direction.

In contrast, in the tenth embodiment, a base electrode 66 has a T-shape. That is, an extended portion 66B of the base electrode 66 extends to a region where the protection diode 46 is arranged in the ninth embodiment (FIG. 21). Therefore, the protection diode 46 is arranged on the opposite side of an emitter electrode 67 with respect to the extended portion 66B. The positional relationship of the base electrode 66, the emitter electrode 67, and the protection diode 46 is the same as the positional relationship of those in the semiconductor device (FIG. 16) according to the seventh embodiment. The sectional structure illustrated in FIG. 24A is the same as the sectional structure illustrated in FIG. 17A of the seventh embodiment.

The positional relationship of the base electrode 66, the emitter electrode 67, and a protection diode 44 is the same as the positional relationship of those in the semiconductor device (FIG. 21) according to the ninth embodiment. The sectional structure illustrated in FIG. 24B is the same as the sectional structure illustrated in FIG. 22B of the ninth embodiment.

In the tenth embodiment, the contact area between the base electrode 66 and a base wiring line B1 can be made larger than that in the ninth embodiment. Furthermore, the Schottky junction region of the protection diode 46 can be made large.

Eleventh Embodiment

Next, a semiconductor device according to an eleventh embodiment will be described with reference to FIGS. 25A and 25B. Hereinafter, descriptions of configurations that are common to the semiconductor device according to the first embodiment (FIGS. 1A to 4B) will be omitted.

Figure 25A:
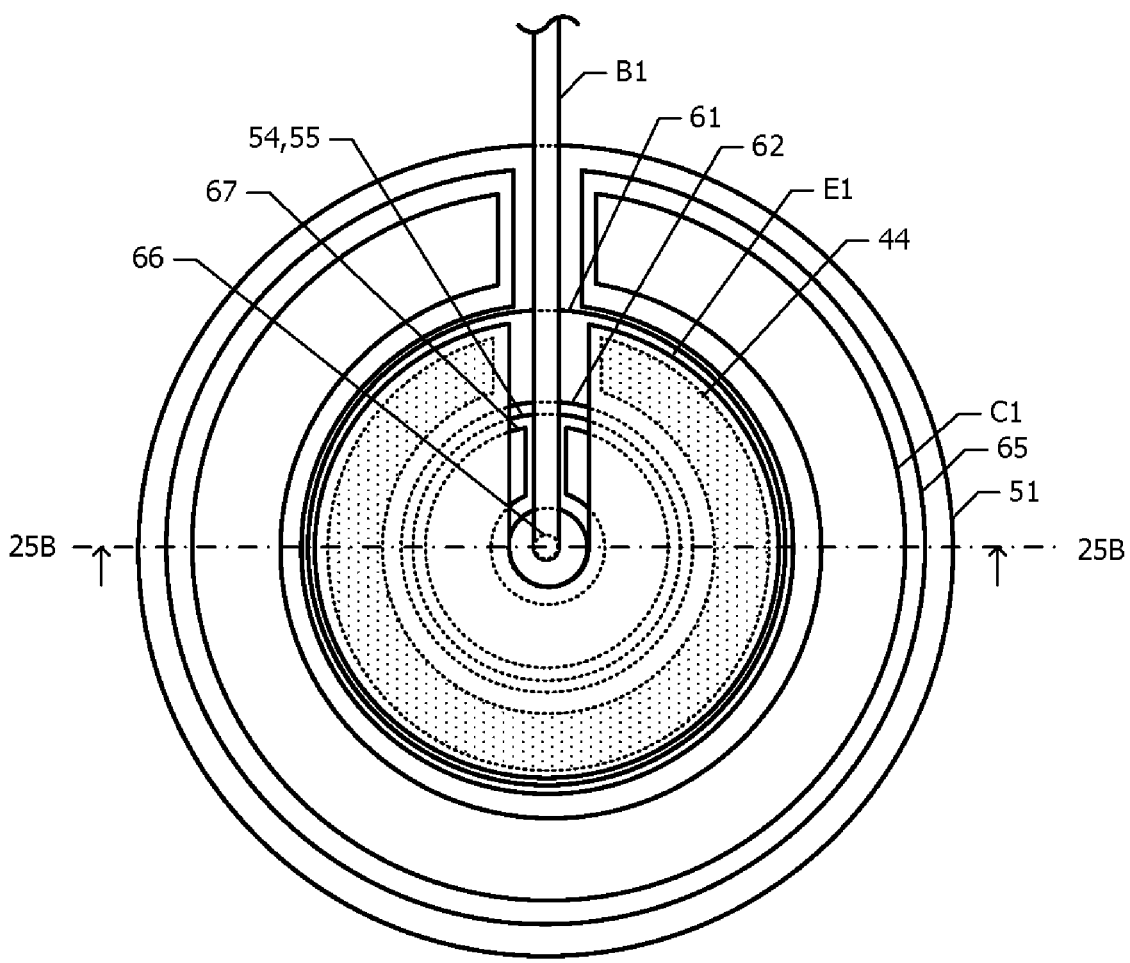
FIG. 25A is a view illustrating the layout of electrodes of a semiconductor device according to an eleventh embodiment.
Figure 25B:
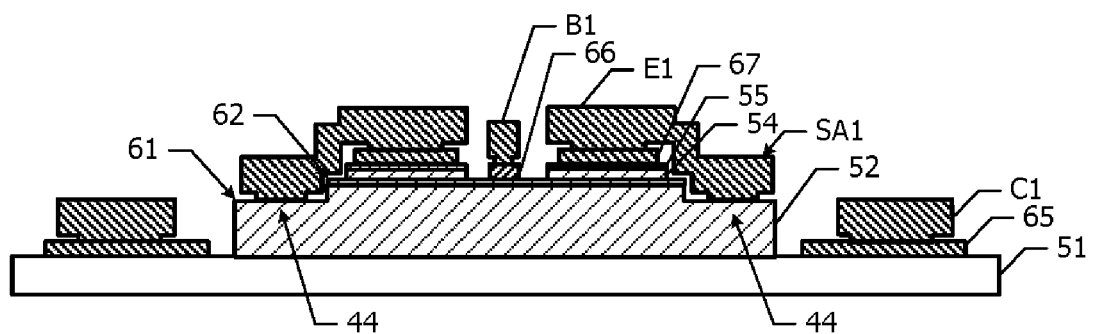
FIG. 25B is a sectional view taken along the dash-dotted line 25B-25B of FIG. 25A.

FIG. 25A is a plan view of a semiconductor device according to the eleventh embodiment, and FIG. 25B is a sectional view taken along the dash-dotted line 25B-25B of FIG. 25A. In the semiconductor device according to the first embodiment, the collector electrode 65 is constituted by a pair of conductor portions arranged apart from each other in the y direction, and the base electrode 66, the emitter electrode 67, and the protection diode 44 are arranged in the base-emitter arrangement region between the pair of the conductor portions.

In contrast, in the eleventh embodiment, an annular collector electrode 65, a part of which is missing, is disposed on a sub-collector layer 51. A first mesa portion 61 is arranged in a region surrounded by the collector electrode 65. A second mesa portion 62 is disposed on a part of the upper surface of the first mesa portion 61. A base electrode 66 is arranged substantially at the center of the second mesa portion 62. Two annular layers of an emitter layer 54 and an emitter contact layer 55 are arranged so as to surround the base electrode 66. An annular emitter electrode 67, a part of which is missing, is disposed on the emitter contact layer 55.

A collector wiring line C1 serving as a first layer is arranged on the collector electrode 65. A base wiring line B1 serving as the first layer and connected to the base electrode 66 extends in the radial direction of the annular collector electrode 65 and reaches the outside of the collector electrode 65. The base wiring line B1 passes through, for example, the missing portions of the collector electrode 65 and the emitter electrode 67. The planar shapes of the collector electrode 65 and the emitter electrode 67 may each be a closed annular shape. However, in the case where these electrodes are formed by a lift-off method, each of the electrodes preferably has an annular planar shape, a part of which is missing, in consideration of the ease of the process.

A metal film including an emitter wiring line E1 serving as the first layer and a first Schottky electrode SA1 is arranged inside an outer peripheral line of the first mesa portion 61 so as not to overlap the base wiring line B1. The first Schottky electrode SA1 forms, outside the second mesa portion 62, a Schottky junction to a collector layer 52 on the upper surface of the first mesa portion 61. A protection diode 44 is formed in a Schottky junction region between the first Schottky electrode SA1 and the collector layer 52.

Also in the eleventh embodiment, as in the first embodiment, the collector layer 52 of an HBT 41 is used in common with a semiconductor portion functioning as a cathode of the protection diode 44, and no insulating region is provided between the collector layer 52 of the HBT 41 and the semiconductor portion. Therefore, miniaturization of the semiconductor device can be achieved.

In the first embodiment, the collector electrode 65 (FIG. 3) is constituted by a pair of linear (strip-shaped) conductor portions arranged in parallel with a gap therebetween. In the eleventh embodiment, the collector electrode 65 is constituted by a conductor portion having an annular planar shape, a part of which is missing, or a closed annular planer shape. As an intermediate embodiment of these configurations, the planar shape of the collector electrode 65 may be, for example, a U-shape along three sides of a rectangular shape or a U-shape along three sides of a rectangular shape having rounded corners.

For example, a semiconductor device may have a configuration in which the collector electrode 65 flanks, from two directions, the base-emitter arrangement region where the base electrode 66, the emitter electrode 67, and the protection diode 44 or 46 are distributed. Alternatively, a semiconductor device may have a configuration in which the collector electrode 65 surrounds the base-emitter arrangement region from three directions or four directions. The configuration in which the collector electrode 65 flanks the base-emitter arrangement region from two directions corresponds to the semiconductor devices according to the first to tenth embodiments. The configuration in which the collector electrode 65 surrounds the base-emitter arrangement region from four directions corresponds to the semiconductor device according to the eleventh embodiment. The configuration in which the collector electrode 65 surrounds the base-emitter arrangement region from three directions corresponds to an embodiment in which the collector electrode 65 has a U-shaped planar shape.

The embodiments described above are exemplary, and, needless to say, a partial replacement or combination of configurations described in different embodiments is possible. The same or similar advantageous effects achieved by the same or similar configurations in a plurality of embodiments will not be mentioned in each of the embodiments. Furthermore, the present disclosure is not limited to the embodiments described above. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a sub-collector layer disposed on a substrate and formed of a semiconductor;
    a bipolar transistor including a collector layer disposed on a surface of the sub-collector layer and formed of a semiconductor having a lower carrier concentration than the sub-collector layer, a base layer disposed on the collector layer and formed of a semiconductor, and an emitter layer disposed on the base layer and formed of a semiconductor; and
    a first protection diode including a first Schottky electrode that forms, in a partial region of an upper surface of the collector layer, a Schottky junction to the collector layer and that is connected to one of the base layer and the emitter layer,
    wherein
    in the collector layer, a part that forms a junction to the base layer and a part that forms a junction to the first Schottky electrode are electrically connected to each other via the collector layer,
    at least a part of the collector layer forms a mesa-shaped first mesa portion disposed on the surface of the sub-collector layer, and a second mesa portion extending from the first mesa portion, the first mesa portion having a first upper surface at a first distance from the surface of the sub-collector layer, the second mesa portion having a second upper surface at a second distance from the surface of the sub-collector layer greater than the first distance, and the mesa-shaped first mesa portion is a single portion of the collector layer that extends from the surface of the sub-collector layer and is separated from any other surrounding portions of the collector layer,
    the base layer forms at least an upper layer portion of the second mesa portion and includes the second upper surface, and
    the first Schottky electrode forms the Schottky junction to the first upper surface of the first mesa portion.

2. The semiconductor device according to claim 1, further comprising:
    a collector electrode that is ohmically connected to the sub-collector layer and includes at least one conductor portion that flanks or surrounds one region in plan view;
    a base electrode that is ohmically connected to the base layer; and
    an emitter electrode that is ohmically connected to the emitter layer,
    wherein a first Schottky junction region of the first protection diode, the base electrode, and the emitter electrode are arranged in a base-emitter arrangement region that is flanked or surrounded by the collector electrode.

3. The semiconductor device according to claim 2, wherein:
    the first Schottky junction region, the emitter electrode, and the base electrode each include a portion that is long in a first direction, and
    portions of the first Schottky junction region, the emitter electrode, and the base electrode that are long in the first direction are arranged side by side in a direction orthogonal to the first direction.

4. The semiconductor device according to claim 3, further comprising:
    an interlayer insulating film disposed on the emitter electrode and the base electrode and having contact holes corresponding to the emitter electrode and the base electrode, the contact holes including portions arranged along the portions of the emitter electrode and the base electrode that are long in the first direction; and an emitter wiring line and a base wiring line that are disposed on the interlayer insulating film and connected through the contact holes to the emitter electrode and the base electrode, respectively.

5. The semiconductor device according to claim 2, wherein:

the emitter electrode and the base electrode each include a portion that is long in a first direction, portions of the emitter electrode and the base electrode that are long in the first direction are arranged side by side in a direction orthogonal to the first direction, and the first Schottky junction region is arranged at a position apart in the first direction with respect to at least one electrode of the emitter electrode and the base electrode.

6. The semiconductor device according to claim 5, further comprising:

an interlayer insulating film disposed on the emitter electrode and the base electrode and having contact holes corresponding to the emitter electrode and the base electrode, the contact holes including portions arranged along the portions of the emitter electrode and the base electrode that are long in the first direction; and an emitter wiring line and a base wiring line that are disposed on the interlayer insulating film and connected through the contact holes to the emitter electrode and the base electrode, respectively.

7. The semiconductor device according to claim 1, further comprising:

a second protection diode including a second Schottky electrode that forms, in a region different from the partial region where the first Schottky electrode forms the Schottky junction to the collector layer, a Schottky junction to the collector layer and that is connected to, of the base layer and the emitter layer, a layer that is not connected to the first Schottky electrode.

8. The semiconductor device according to claim 7, further comprising:

a collector electrode that is ohmically connected to the sub-collector layer and includes at least one conductor portion that flanks or surrounds one region in plan view;

a base electrode that is ohmically connected to the base layer; and an emitter electrode that is ohmically connected to the emitter layer, wherein a first Schottky junction region of the first protection diode, the base electrode, and the emitter electrode are arranged in a base-emitter arrangement region that is flanked or surrounded by the collector electrode.

9. The semiconductor device according to claim 8, wherein:

the first Schottky junction region, the emitter electrode, and the base electrode each include a portion that is long in a first direction, and portions of the first Schottky junction region, the emitter electrode, and the base electrode that are long in the first direction are arranged side by side in a direction orthogonal to the first direction.

10. The semiconductor device according to claim 8, wherein:

the emitter electrode and the base electrode each include a portion that is long in a first direction, portions of the emitter electrode and the base electrode that are long in the first direction are arranged side by side in a direction orthogonal to the first direction, and the first Schottky junction region is arranged at a position apart in the first direction with respect to at least one electrode of the emitter electrode and the base electrode.

11. A semiconductor device comprising:

a sub-collector layer disposed on a substrate and formed of a semiconductor;

a bipolar transistor including a collector layer disposed on a surface of the sub-collector layer and formed of a semiconductor having a lower carrier concentration than the sub-collector layer, a base layer disposed on the collector layer and formed of a semiconductor, and an emitter layer disposed on the base layer and formed of a semiconductor;

a first protection diode including a first Schottky electrode that forms, in a partial region of an upper surface of the collector layer, a Schottky junction to the collector layer and that is connected to one of the base layer and the emitter layer; and a second protection diode including a second Schottky electrode that forms, in a region different from the partial region where the first Schottky electrode forms the Schottky junction to the collector layer, a Schottky junction to the collector layer and that is connected to, of the base layer and the emitter layer, a layer that is not connected to the first Schottky electrode, wherein in the collector layer, a part that forms a junction to the base layer and a part that forms a junction to the first Schottky electrode are electrically connected to each other via the collector layer, at least a part of the collector layer forms a mesa-shaped first mesa portion disposed on the surface of the sub-collector layer, and a second mesa portion extending from the first mesa portion, the first mesa portion having a first upper surface at a first distance from the surface of the sub-collector layer, and the second mesa portion having a second upper surface at a second distance from the surface of the sub-collector layer greater than the first distance, and the base layer forms at least an upper layer portion of the second mesa portion and includes the second upper surface.

12. The semiconductor device according to claim 11, further comprising:

a collector electrode that is ohmically connected to the sub-collector layer and includes at least one conductor portion that flanks or surrounds one region in plan view;

a base electrode that is ohmically connected to the base layer; and an emitter electrode that is ohmically connected to the emitter layer, wherein a first Schottky junction region of the first protection diode, the base electrode, and the emitter electrode are arranged in a base-emitter arrangement region that is flanked or surrounded by the collector electrode.

13. The semiconductor device according to claim 12, wherein:
the first Schottky junction region, the emitter electrode, and the base electrode each include a portion that is long in a first direction, and
portions of the first Schottky junction region, the emitter electrode, and the base electrode that are long in the first direction are arranged side by side in a direction orthogonal to the first direction.

14. The semiconductor device according to claim 12, wherein:
the emitter electrode and the base electrode each include a portion that is long in a first direction,
portions of the emitter electrode and the base electrode that are long in the first direction are arranged side by side in a direction orthogonal to the first direction, and
the first Schottky junction region is arranged at a position apart in the first direction with respect to at least one electrode of the emitter electrode and the base electrode.

15. A semiconductor device comprising:
a sub-collector layer disposed on a substrate and formed of a semiconductor;
a bipolar transistor including a collector layer disposed on a surface of the sub-collector layer and formed of a semiconductor having a lower carrier concentration than the sub-collector layer, a base layer disposed on the collector layer and formed of a semiconductor, and an emitter layer disposed on the base layer and formed of a semiconductor;
a first protection diode including a first Schottky electrode that forms, in a partial region of an upper surface of the collector layer, a Schottky junction to the collector layer and that is connected to one of the base layer and the emitter layer;
a collector electrode that is ohmically connected to the sub-collector layer and includes at least one conductor portion that flanks or surrounds one region in plan view;
a base electrode that is ohmically connected to the base layer; and
an emitter electrode that is ohmically connected to the emitter layer,
wherein
in the collector layer, a part that forms a junction to the base layer and a part that forms a junction to the first Schottky electrode are electrically connected to each other via the collector layer,
at least a part of the collector layer forms a mesa-shaped first mesa portion disposed on the surface of the sub-collector layer, and a second mesa portion extending from the first mesa portion, the first mesa portion having a first upper surface at a first distance from the surface of the sub-collector layer, and the second mesa portion having a second upper surface at a second distance from the surface of the sub-collector layer greater than the first distance,
the base layer forms at least an upper layer portion of the second mesa portion and includes the second upper surface,
a first Schottky junction region of the first protection diode, the base electrode, and the emitter electrode are arranged in a base-emitter arrangement region that is flanked or surrounded by the collector electrode,
the emitter electrode and the base electrode each include a portion that is long in a first direction,
portions of the emitter electrode and the base electrode that are long in the first direction are arranged side by side in a direction orthogonal to the first direction, and
the first Schottky junction region is arranged at a position apart in the first direction with respect to at least one electrode of the emitter electrode and the base electrode.

16. The semiconductor device according to claim 15, further comprising:
an interlayer insulating film disposed on the emitter electrode and the base electrode and having contact holes corresponding to the emitter electrode and the base electrode, the contact holes including portions arranged along the portions of the emitter electrode and the base electrode that are long in the first direction; and
an emitter wiring line and a base wiring line that are disposed on the interlayer insulating film and connected through the contact holes to the emitter electrode and the base electrode, respectively.

* * * * *